US012656691B2

(12) United States Patent
Peng et al.

(10) Patent No.: US 12,656,691 B2
(45) Date of Patent: Jun. 16, 2026

(54) OPTIMIZATION OF SCANNER THROUGHPUT AND IMAGING QUALITY FOR A PATTERNING PROCESS

(71) Applicant: ASML NETHERLANDS B.V., Veldhoven (NL)

(72) Inventors: Xingyue Peng, San Jose, CA (US); Duan-Fu Stephen Hsu, Fremont, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 591 days.

(21) Appl. No.: 18/027,093

(22) PCT Filed: Sep. 24, 2021

(86) PCT No.: PCT/EP2021/076419
§ 371 (c)(1),
(2) Date: Mar. 18, 2023

(87) PCT Pub. No.: WO2022/064016
PCT Pub. Date: Mar. 31, 2022

(65) Prior Publication Data
US 2023/0333483 A1      Oct. 19, 2023

Related U.S. Application Data

(60) Provisional application No. 63/083,412, filed on Sep. 25, 2020.

(51) Int. Cl.
G03F 7/00          (2006.01)
(52) U.S. Cl.
CPC ...... G03F 7/70558 (2013.01); G03F 7/70125 (2013.01); G03F 7/705 (2013.01)

(58) Field of Classification Search
CPC .. G03F 7/70558; G03F 7/70125; G03F 7/705; G03F 7/70425; G03F 7/70441
(Continued)

(56) References Cited

U.S. PATENT DOCUMENTS 5,229,872 A      7/1993    Mumola
6,046,792 A      4/2000    Van Der Werf et al.
(Continued)

FOREIGN PATENT DOCUMENTS

JP          2003142388        5/2003
WO          2010/059954       5/2010
(Continued)

OTHER PUBLICATIONS

International Search Report and Written Opinion issued in corresponding International Application No. PCT/EP2021/076419, dated Mar. 31, 2022.
(Continued)

*Primary Examiner* — Caleen O Sullivan
(74) *Attorney, Agent, or Firm* — Pillsbury Winthrop Shaw Pittman LLP

(57) ABSTRACT

A method for source mask optimization to increase scanner throughput for a patterning process is described. The method includes computing a multi-variable cost function of design variables that are representative of characteristics of the patterning process. The design variables may include (a) an illumination variable that is characteristic of an illumination system, and (b) a design layout variable that is characteristic of a design layout. The multi-variable cost function may be a function of a throughput of the patterning process. The method further includes reconfiguring the characteristics of the patterning process by adjusting the design variables until a predefined termination condition is satisfied.

20 Claims, 25 Drawing Sheets

(58) Field of Classification Search
USPC ............................................................ 430/5
See application file for complete search history.

(56) References Cited

U.S. PATENT DOCUMENTS

| | | | |
|---|---|---|---|
| 7,003,758 | B2 | 2/2006 | Ye et al. |
| 7,587,704 | B2 | 9/2009 | Ye et al. |
| 2007/0031745 | A1 | 2/2007 | Ye et al. |
| 2007/0050749 | A1 | 3/2007 | Ye et al. |
| 2008/0301620 | A1 | 12/2008 | Ye et al. |
| 2008/0309897 | A1 | 12/2008 | Wong et al. |
| 2009/0157360 | A1 | 6/2009 | Ye et al. |
| 2010/0162197 | A1 | 6/2010 | Ye et al. |
| 2010/0180251 | A1 | 7/2010 | Ye et al. |
| 2010/0315614 | A1 | 12/2010 | Hansen |
| 2019/0369480 | A1* | 12/2019 | Hansen ...................... G03F 1/36 |
| 2020/0159125 | A1* | 5/2020 | Hansen .................. G06F 30/398 |
| 2020/0249578 | A1 | 8/2020 | Hsu et al. |
| 2024/0119212 | A1* | 4/2024 | Ser ............................ G03F 1/70 |

FOREIGN PATENT DOCUMENTS

| | | |
|---|---|---|
| WO | 2020/094389 | 5/2020 |
| WO | 2020/169303 | 8/2020 |

OTHER PUBLICATIONS

Anonymous, "Enhanced Lithographic Throughput by Improved Source and Mask Optimization Flow", Research Disclosure, Kenneth Mason Publications, Hampshire, vol. 631, No. 30 (2016).

Anonymous, "Optimization of Scanner Throughput and Imaging Quality for a Patterning Process", Research Disclosure, Kenneth Mason Publications, vol. 680, No. 79 (Nov. 2020).

C.A. Mack et al., "Resist Metrology for Lithography Simulation, Part 1: Exposure Parameter Measurements", Proc. of SPIE, vol. 2725, pp. 34-38 (1996).

C. Spence, "Full-chip lithography simulation and design analysis: how OPC is changing IC design", Proc. of SPIE, vol. 5751, pp. 1-14, (2005).

Yu Cao et al., "Optimized Hardware and Software for Fast, Full Chip Simulation", Proc. SPIE, vol. 5754, 405 (2005).

Alan E. Rosenbluth et al., "Optimum Mask and Source Patterns to Print a Given Shape", Journal of Microlithography, Microfabrication, Microsystems 1(1), pp. 13-20, (2002).

Yuri Granik, "Source optimization for image fidelity and throughput", Journal of Microlithography, Microfabrication, Microsystems 3(4), pp. 509-522, (2004).

Robert Socha et al., "Simultaneous Source Mask Optimization (SMO)", Proc. SPIE, vol. 5853, pp. 180-193, (2005).

* cited by examiner

400

505

510

515

515

600

700

800

850

OPTIMIZATION OF SCANNER THROUGHPUT AND IMAGING QUALITY FOR A PATTERNING PROCESS

CROSS-REFERENCE TO RELATED APPLICATIONS

This application is the U.S. national phase entry of PCT Patent Application No. PCT/EP2021/076419 which was filed on Sep. 24, 2021, which claims priority of U.S. Provisional Patent Application No. 63/083,412 which was filed on Sep. 25, 2020, and which is incorporated herein in its entirety by reference.

TECHNICAL FIELD

The present description relates generally to improving and optimizing lithography processes. More particularly, apparatus, methods, and computer programs for source mask optimization configured to optimize scanner throughput and imaging quality of patterning process are described.

BACKGROUND

A lithographic projection apparatus can be used, for example, in the manufacture of integrated circuits (ICs). In such a case, a patterning device (e.g., a mask) may contain or provide a pattern corresponding to an individual layer of the IC ("design layout"). This pattern can be transferred onto a target portion (e.g. comprising one or more dies) on a substrate (e.g., silicon wafer) that has been coated with a layer of radiation-sensitive material ("resist"), by methods such as irradiating the target portion through the pattern on the patterning device. In general, a single substrate contains a plurality of adjacent target portions to which the pattern is transferred successively by the lithographic projection apparatus, one target portion at a time. In one type of lithographic projection apparatus, the pattern on the entire patterning device is transferred onto one target portion in one operation. Such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern on the patterning device are transferred to one target portion progressively. Since, in general, the lithographic projection apparatus will have a reduction ratio M (e.g., 4), and the reduction ratio can be different in x and y direction features the speed F at which the substrate is moved will be 1/M times that at which the projection beam scans the patterning device. More information with regard to lithographic devices as described herein can be gleaned, for example, from U.S. Pat. No. 6,046,792, incorporated herein by reference.

Prior to transferring the pattern from the patterning device to the substrate, the substrate may undergo various procedures, such as priming, resist coating and a soft bake. After exposure, the substrate may be subjected to other procedures ("post-exposure procedures"), such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

As noted, lithography is a central step in the manufacturing of device such as ICs, where patterns formed on substrates define functional elements of the devices, such as microprocessors, memory chips, etc. Similar lithographic techniques are also used in the formation of flat panel displays, micro-electro mechanical systems (MEMS) and other devices.

As semiconductor manufacturing processes continue to advance, the dimensions of functional elements have continually been reduced while the amount of functional elements, such as transistors, per device has been steadily increasing over decades, following a trend commonly referred to as "Moore's law". At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is commonly known as low-$k_1$ lithography, according to the resolution formula $CD=k_1 \times \lambda/NA$, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a designer in order to achieve particular electrical functionality and performance. To overcome these difficulties, sophisticated fine-tuning steps are applied to the lithographic projection apparatus, the design layout, or the patterning device. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

SUMMARY

According to an embodiment, there is provided a non-transitory computer readable medium having instructions that, when executed by a computer, cause the computer to execute a method for imaging portions of design layouts onto a substrate using a lithographic projection apparatus having an illumination source and projection optics. The method includes receiving a physical dose, wherein the physical dose is indicative of a dose received from the illumination source at the substrate through an open-frame mask; inputting the physical does and a plurality of design variables that are representative of characteristics of a patterning process into a lithographic model, wherein the design variables includes (a) a pupil shape of an illumination source of a lithographic projection apparatus, and (b) a design layout to be printed on a substrate using the lithographic projection apparatus. The lithographic model is configured to: compute, using the physical dose, a multi-variable cost function of the plurality of design variables, wherein the multi-variable cost function is a function of a throughput of the patterning process, and adjust the design variables until a predefined termination condition is satisfied. The method further includes receiving an output from the lithographic model based on the physical dose, the output including an image of an adjusted design layout and an image of an adjusted pupil shape of the illumination source; and generating for display, on a user interface, the output.

According to an embodiment, there is provided a non-transitory computer readable medium having instructions that, when executed by a computer, cause the computer to execute a method for improving a patterning process for imaging a portion of a design layout onto a substrate using a lithographic projection apparatus having an illumination source and projection optics. The method includes computing a multi-variable cost function of a plurality of design variables that are representative of characteristics of the patterning process, wherein the design variables includes (a) an illumination source variable that is characteristic of the illumination source, and (b) a design layout variable that is characteristic of the design layout, wherein the multi-variable cost function is a function of a throughput of the patterning process; and reconfiguring the characteristics of the patterning process by adjusting the design variables until a predefined termination condition is satisfied.

According to an embodiment, there is provided a non-transitory computer readable medium having instructions that, when executed by a computer, cause the computer to execute a method for improving a patterning process for imaging a portion of a design layout onto a substrate using a lithographic projection apparatus having an illumination source and projection optics. The method includes obtaining a physical dose, wherein the physical dose is indicative of an energy density received from the illumination source at the substrate through an open-frame mask accumulated through a specified exposure time; and computing the throughput as a function of the physical dose and one or more lithographic projection apparatus parameters.

According to an embodiment, there is provided a method for improving a patterning process for imaging a portion of a design layout onto a substrate using a lithographic projection apparatus having an illumination source and projection optics. The method includes computing, using a hardware computer system, a multi-variable cost function of a plurality of design variables that are representative of characteristics of the patterning process, wherein the design variables includes (a) an illumination source variable that is characteristic of the illumination source, and (b) a design layout variable that is characteristic of the design layout, wherein the multi-variable cost function is a function of a throughput of the patterning process. The method further includes reconfiguring, using the hardware computer system, the characteristics of the patterning process by adjusting the design variables until a predefined termination condition is satisfied.

According to an embodiment, there is provided a method for determining a throughput of a patterning process for imaging a portion of a design layout onto a substrate using a lithographic projection apparatus having an illumination source and projection optics. The method includes obtaining, using a hardware computer system, a physical dose, wherein the physical dose is indicative of an energy density received at the substrate through an open-frame mask accumulated through a specified exposure time; and computing, using the hardware computer system, the throughput as a function of the physical dose.

According to another embodiment, there is provided a computer program product comprising a non-transitory computer readable medium having instructions recorded thereon, the instructions when executed by a computer implementing the methods described above.

DETAILED DESCRIPTION

Figure 1:
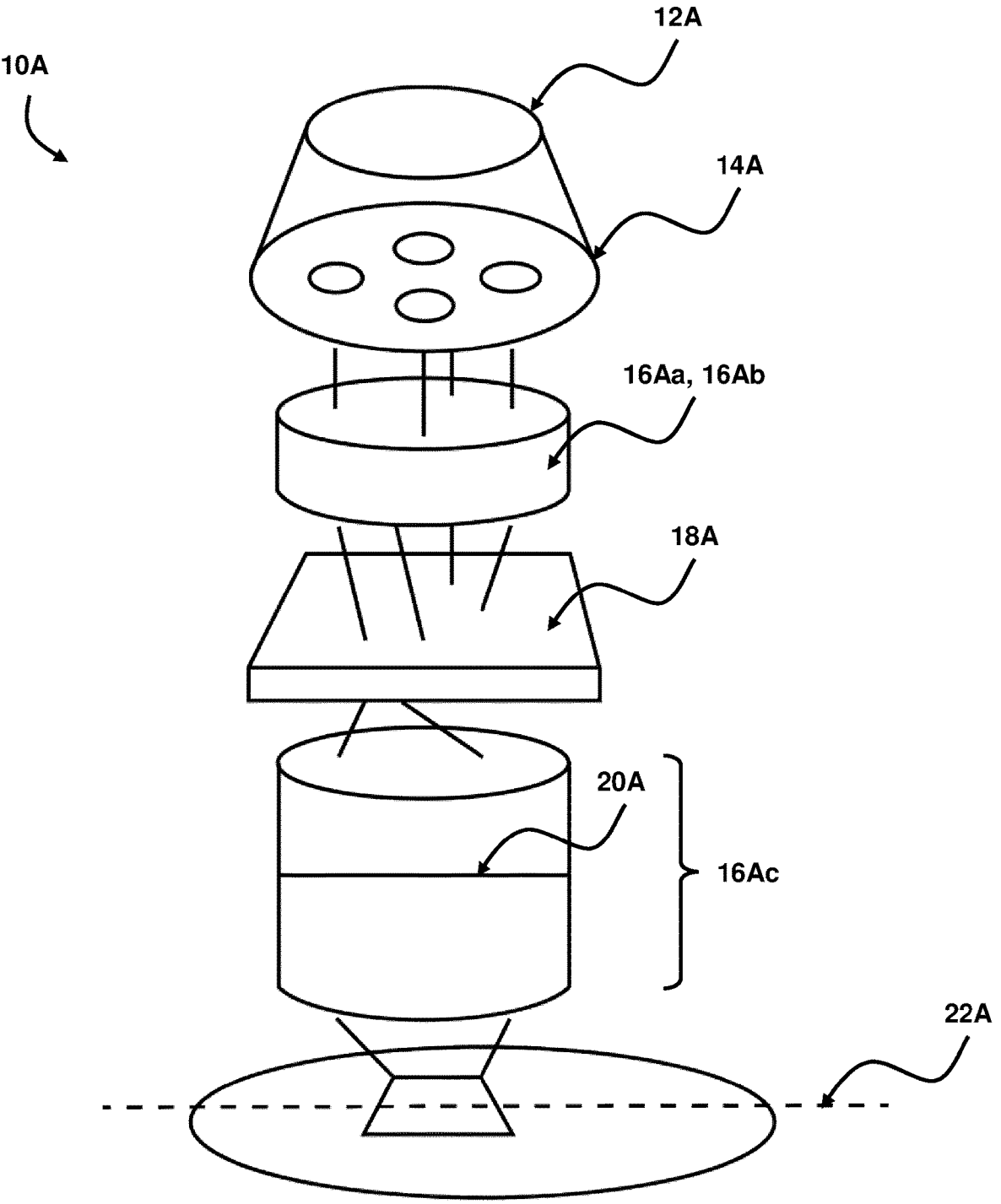
FIG. 1 shows a block diagram of various subsystems of a lithography system.

The source exposure dose impacts scanner throughput for imaging operations related to extreme ultraviolet (EUV) patterning processes. For example, a lower dose may correlate with lower scanner throughput as a wafer has to be exposed to the radiation for a longer time. Scanner throughput is measured in units of wafers per hour, for example. As such, the exposure dose is an important factor to consider during source mask optimization (SMO) and/or other operations. In some embodiments, SMO is a process which optimizes the source and patterning device pattern in order to maximize imaging quality (e.g., image contrast, edge placement error, CD uniformity, resist contours, depth of focus, etc.) of the patterning process. Traditional SMO methods, while configured to optimize an imaging quality of the patterning process, they are not configured to optimize throughput, much less based on source exposure dose.

Some prior SMO methods discuss optimizing throughput of the patterning process. However, these methods have drawbacks. For example, some SMO methods consider determining a relative throughput, such as a specified percentage above or below a desired throughput, and not absolute throughput, such as wafers per hour. In another example, the prior methods consider a relative dose, and not a physical dose of the source, thereby being incapable of providing an absolute throughput. Further, these methods, besides consuming a significant amount of computing resources in determining the relative throughput, they do not factor in resist model, any significant changes in source shape, or obscurations in the optical system of the source in determining the relative throughput. In another example, the prior methods may consider resist models in determining throughput, but they are complex, time consuming, resource intensive, and difficult to integrate with traditional SMO methods.

The embodiments of the present disclosure discuss an improved SMO process that optimizes a throughput and imaging quality of the patterning process. The improved SMO process determines the throughput (e.g., absolute throughput in wafers per hour (wph)) based on a physical dose of a source of a lithographic apparatus, and may determine the throughput for any source shape (e.g., pupil shape of the source) and patterning device pattern (e.g., which corresponds to a design layout to be printed on the wafer). The disclosed embodiments are applicable to any type of lithographic apparatus, e.g., EUV or deep ultraviolet (DUV), or transmissive or reflective; obscured or unobscured. The disclosed embodiments are applicable to aerial images and resist models, for example. The disclosed embodiments are applicable for any numerical aperture (NA) and/or wavelength. The disclosed embodiments are applicable to any chip design (e.g., memory chips, logic chips, microprocessor chips, and/or other chips).

Although specific reference may be made in this text to the manufacture of ICs, it should be understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass EUV (extreme ultra-violet radiation, e.g. having a wavelength in the range of about 3-100 nm) radiation. However, other applications of the present method with other types of electromagnetic radiation, including ultraviolet radiation (e.g. with a wavelength of 365, 248, 193, 157 or 126 nm), is contemplated.

A patterning device can comprise, or can form, one or more design layouts. The design layout can be generated utilizing CAD (computer-aided design) programs. This process is often referred to as EDA (electronic design automation). Most CAD programs follow a set of predetermined design rules in order to create functional design layouts/patterning devices. These rules are set based processing and design limitations. For example, design rules define the space tolerance between devices (such as gates, capacitors, etc.) or interconnect lines, to ensure that the devices or lines do not interact with one another in an undesirable way. One or more of the design rule limitations may be referred to as a "critical dimension" (CD). A critical dimension of a device can be defined as the smallest width of a line or hole, or the smallest space between two lines or two holes. Thus, the CD regulates the overall size and density of the designed device.

One of the goals in device fabrication is to faithfully reproduce the original design intent on the substrate (via the patterning device).

The term "mask", "reticle" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective; binary, phase-shifting, hybrid, etc.), examples of other such patterning devices include a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means. Examples of other such patterning devices also include a programmable LCD array. An example of such a construction is given in U.S. Pat. No. 5,229,872, which is incorporated herein by reference.

As a brief introduction, FIG. 1 illustrates an exemplary lithographic projection apparatus 10A. Major components are a radiation source 12A, which may be an extreme ultra violet (EUV) source or another type of source (as discussed above, the lithographic projection apparatus itself need not have the radiation source), illumination optics which, for example, define the partial coherence (denoted as sigma) and which may include optics 14A, 16Aa and 16Ab that shape radiation from the source 12A; a patterning device (or mask) 18A; and transmission optics 16Ac that project an image of the patterning device pattern onto a substrate plane 22A.

A pupil 20A can be included with transmission optics 16Ac. In some embodiments, there can be one or more pupils before and/or after mask 18A. As described in further detail herein, pupil 20A can provide patterning of the light that ultimately reaches substrate plane 22A. An adjustable filter or aperture at the pupil plane of the projection optics may restrict the range of beam angles that impinge on the substrate plane 22A, where the largest possible angle defines the numerical aperture of the projection optics NA=n sin $(\Theta_{max})$, wherein n is the refractive index of the media between the substrate and the last element of the projection optics, and $\Theta_{max}$ is the largest angle of the beam exiting from the projection optics that can still impinge on the substrate plane 22A.

In a lithographic projection apparatus, a source provides illumination (i.e. radiation) to a patterning device and projection optics direct and shape the illumination, via the patterning device, onto a substrate. The projection optics may include at least some of the components 14A, 16Aa, 16Ab and 16Ac. An aerial image (AI) is the radiation intensity distribution at substrate level. A resist model can be used to calculate the resist image from the aerial image, an example of which can be found in U.S. Patent Application Publication No. US 2009-0157630, the disclosure of which is hereby incorporated by reference in its entirety. The resist model is related only to properties of the resist layer (e.g., effects of chemical processes that occur during exposure, post-exposure bake (PEB) and development). Optical properties of the lithographic projection apparatus (e.g., properties of the illumination, the patterning device and the projection optics) dictate the aerial image and can be defined in an optical model. Since the patterning device used in the lithographic projection apparatus can be changed, it is desirable to separate the optical properties of the patterning device from the optical properties of the rest of the lithographic projection apparatus including at least the source and the projection optics. Details of techniques and models used to transform a design layout into various lithographic images (e.g., an aerial image, a resist image, etc.), applying OPC using those techniques and models, and evaluating performance (e.g., in terms of process window) are described in U.S. Patent Application Publication Nos. US 2008-0301620, 2007-0050749, 2007-0031745, 2008-0309897, 2010-0162197, and 2010-0180251, the disclosure of each being hereby incorporated by reference in its entirety.

Figure 2:
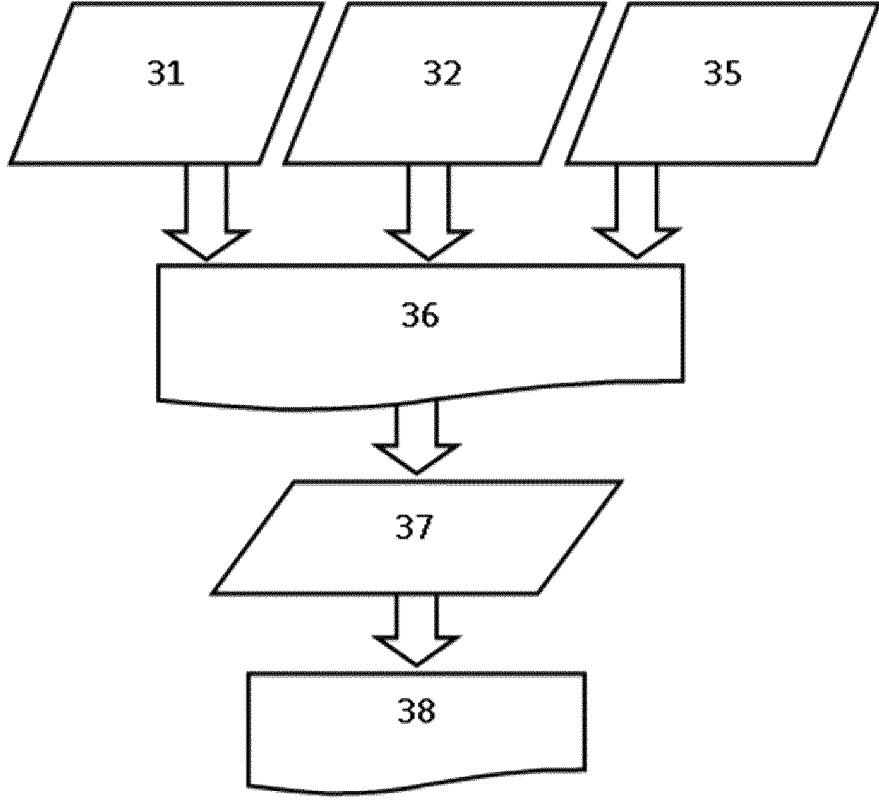
FIG. 2 is flow chart of a method for determining a patterning device pattern or a target pattern to be printed on a substrate, according to an embodiment.

An exemplary flow chart for simulating lithography in a lithographic projection apparatus is illustrated in FIG. 2. Simulating lithography for a lithographic projection apparatus may utilize a source model 31 that represents optical characteristics (including radiation intensity distribution and/or phase distribution) of the source. A projection optics model 32 represents optical characteristics (including changes to the radiation intensity distribution and/or the phase distribution caused by the projection optics) of the projection optics. A design layout model 35 represents optical characteristics (including changes to the radiation intensity distribution and/or the phase distribution caused by a given design layout) of a design layout, which is the representation of an arrangement of features on or formed by a patterning device. An aerial image 36 can be simulated from the design layout model 35, the projection optics model 32 and the design layout model 35. A resist image 38 can be simulated from the aerial image 36 using a resist model 37. Simulation of lithography can, for example, predict contours and CDs in the resist image.

More specifically, it is noted that the source model 31 can represent the optical characteristics of the source that include, but not limited to, NA-sigma ($\sigma$) settings as well as any particular illumination source shape (e.g. off-axis radiation sources such as annular, quadrupole, and dipole, etc.). The projection optics model 32 can represent the optical characteristics of the of the projection optics that include aberration, distortion, refractive indexes, physical sizes, physical dimensions, etc. The design layout model 35 can also represent physical properties of a physical patterning device, as described, for example, in U.S. Pat. No. 7,587, 704, which is incorporated by reference in its entirety. The objective of the simulation is to accurately predict imaging quality, for example, edge placement errors, aerial image intensity slopes, CDs, depth of focus, image contrast, resist contours, etc., which can then be compared against an intended design. The intended design is generally defined as a pre-OPC design layout which can be provided in a standardized digital file format such as GDSII or OASIS or other file format.

A lithographic simulation model (referred to as "lithographic model") may predict the imaging quality of a patterning process as a function of a number of design variables of the patterning process, e.g., using the simulation method described at least with reference to FIG. 2 above and FIGS. 11-14 below. In some embodiments, the design variables may include one or more adjustable parameters, such as adjustable parameters of an illumination source (1200A) (e.g., pupil shape, pupil fill ratio, namely percentage of radiation of the source that passes through a pupil or aperture, illumination efficiency), characteristics of the projection optics (1200B) and characteristics of the design layout (1200C), etc. In some embodiments, the imaging quality may be indicative of one or more of edge placement errors, aerial image intensity slopes, CDs, depth of focus, image contrast, resist contours, etc.

From the above, it will be appreciated that, in some embodiments, a model is a function that receives one or more input parameters, performs one or more operations on the input parameters, and generates an output based on the operations. For example, the lithographic model is a function that receives one or more design variables of the patterning process as input parameters, performs one or more operations on the design variables to predict or determine the imaging quality as output.

In some embodiments, the disclosed embodiments may improve the lithographic model to generate a throughput-aware lithographic model (referred to as "TPT lithographic model") that may optimize a throughput of the patterning process along with the imaging quality. The TPT lithographic model may determine a throughput of the patterning process based on a physical dose of the source. The following paragraphs describe the operation of TPT lithographic model in accordance with one or more embodiments.

Figure 3:
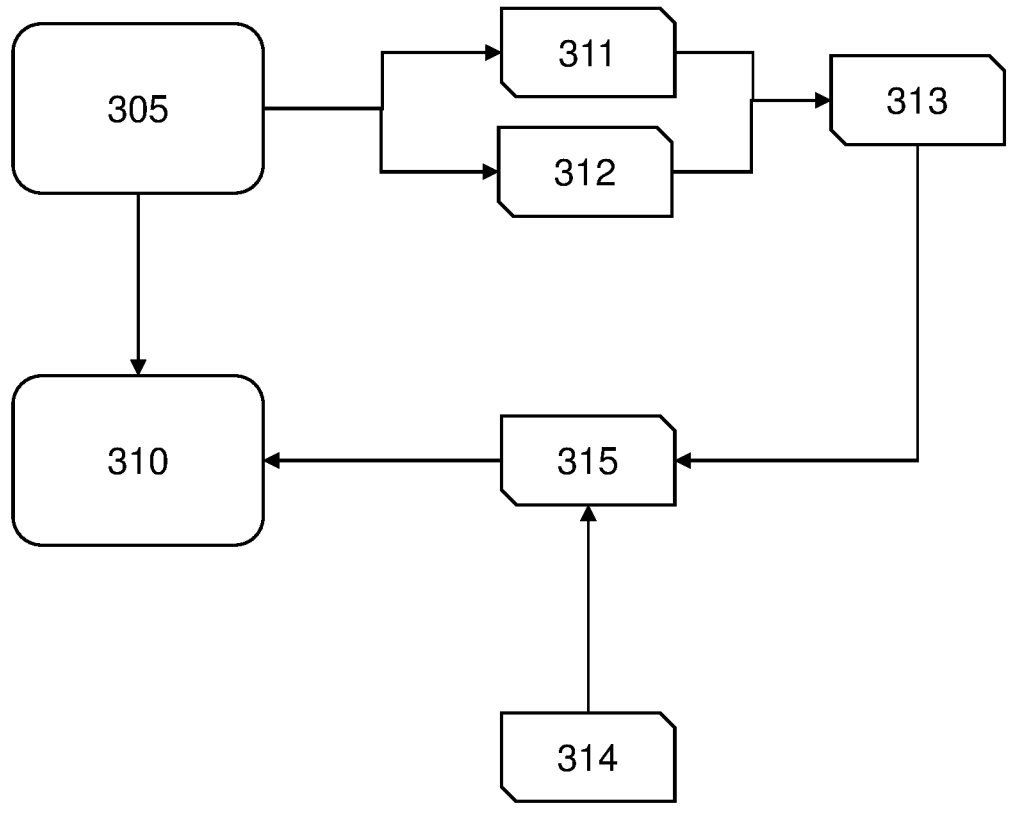
FIG. 3 is a block diagram illustrating generation of a physical dose-based lithographic model, in accordance with one or more embodiments

FIG. 3 is a block diagram illustrating generation of a physical dose-based lithographic model 310, in accordance with one or more embodiments. In some embodiments, a physical dose is an energy density received at the substrate plane 22A accumulated through a specified exposure time (e.g., dose sensed by a sensor placed in the substrate plane 22A) when the patterning device 18A is replaced with an open-frame (e.g., no mask or a blank glass mask). To generate the physical dose-based lithographic model 310, an aerial image (AI) threshold 311 and white mask intensity (wmi) 312 values are obtained from a lithographic model 305. In some embodiments, AI threshold 311 is indicative of a minimum AI intensity required to predict a resist development in the substrate for a mask corresponding to a design layout to be printed on the substrate, and the wmi 312 is AI intensity corresponding to an open-frame mask.

An exposure margin 313, α, is computed as a function of the AI threshold 311 and the wmi 312. For example, the exposure margin 313 may be computed as a ratio of the wmi 312 to the AI threshold 311. The exposure margin 313 may be represented as:

$$\alpha = \frac{wmi}{AI\ threshold} \qquad \text{Eq. (1A)}$$

A dose-to-size 314, d2s, which is indicative of the physical dose is obtained (e.g., as user input). In some embodiments, dose-to-size 314 is also defined as the physical dose required to print an anchor feature on the wafer. In some embodiments, the anchor feature is the most dense and critical pattern in the design layout or a feature that may be specified by a user.

In some embodiments, a dose-to-clear 315, d2c, is the minimum physical dose required to cause a uniform chunk of resist to develop. The dc2 315 may be computed as a function of the exposure margin 313 and the dose-to-size 314. For example, the dose-to-clear 315 may be computed as a ratio of the dose-to-size 314 to the exposure margin 313. The dose-to-clear 315 may be represented as:

$$d2c = \frac{d2s}{\alpha} \qquad \text{Eq. (1B)}$$

In some embodiments, the exposure margin 313 may be computed as a ratio between the dose2size 314 and the dose2clear 315. However, when the lithographic model 305 is well calibrated (e.g., the physical dose is adjusted such that the anchor feature is printed on the substrate), the exposure margin 313 may also be equal to the ratio between the wmi 312 and the AI threshold 311.

After determining the dose-to-clear 315, the dose-to-clear 315 is added to the lithographic model 305 to generate the physical dose-based lithographic model 310, which may then be used to determine a throughput of the patterning process, as described in the following paragraphs.

Figure 4A:
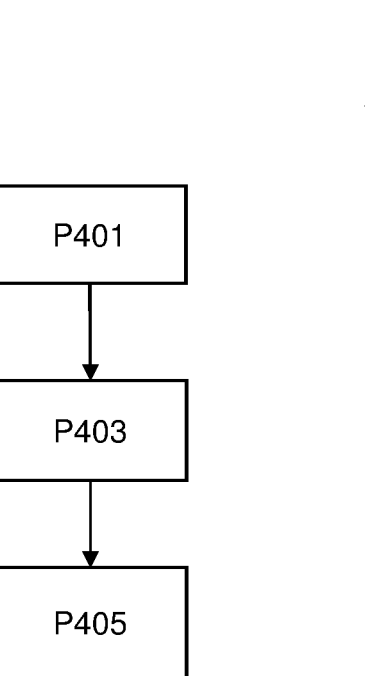
FIG. 4A is a flow diagram of a process for determining a throughput of the patterning process based on the physical dose, in accordance with one or more embodiments.
Figure 4B:
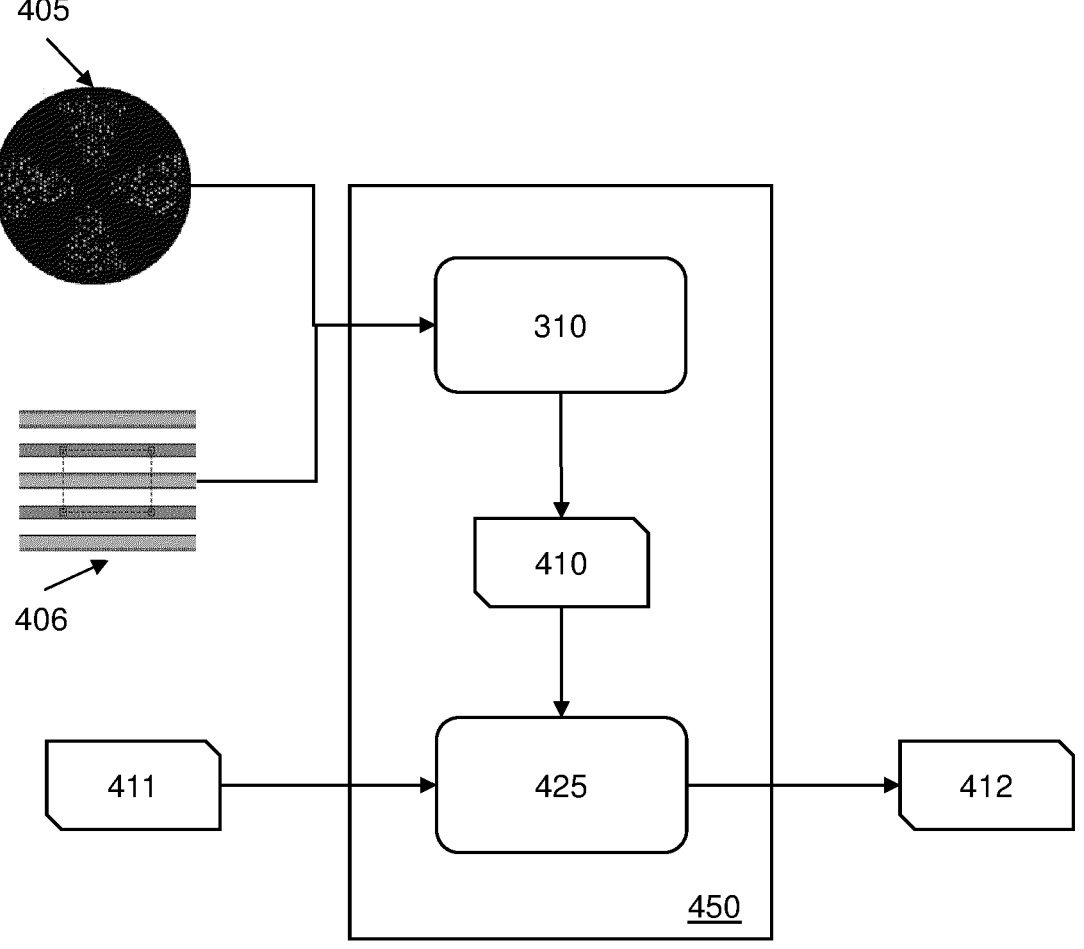
FIG. 4B illustrates operation of a throughput (TPT) lithographic model, in accordance with one or more embodiments

FIG. 4A is a flow diagram of a process 400 for determining a throughput of the patterning process based on the physical dose, in accordance with one or more embodiments. The process 400 is described in relation to FIG. 4B, which illustrates operation of a TPT lithographic model 450, in accordance with one or more embodiments.

At operation P401, design variables that are characteristics of the patterning process, such as a pupil shape 405 and mask pattern 406 are obtained (e.g., as user input). In some embodiments, the pupil shape 405 is the illumination shape (that is generally the shape of an illumination source) as described in FIG. 1, and mask pattern 406 may be a pattern corresponding to the design layout to be printed on the wafer. In one embodiment, the mask pattern 406 may be a GDS file.

At operation P403, a physical dose 410 is obtained from the physical dose-based lithographic model 310, which is generated as described at least with reference to FIG. 3. In some embodiments, the physical dose 410 is obtained as a function of the dose2clear 315 and the exposure margin 313 values from the physical dose-based lithographic model 310. For example, the physical dose 410, dose, is obtained as a product of the dose2clear 315 and the exposure margin 313 values, which may be represented as:

$$dose = d2c * \alpha \qquad \text{Eq. (1C)}$$

At operation P405, a throughput 412 of the patterning process is determined based on the physical dose 410. In some embodiments, the throughput of the patterning process may be determined as a function of the physical dose 410 and lithographic apparatus properties 411, which are independent of the lithographic model 305. Examples of lithographic apparatus properties include source power, field size, illumination efficiency, or other such properties. The throughput, TPT, may be expressed as:

$$TPT = f(dose, \text{lithographic apparatus properties}) \qquad \text{Eq. (1D)}$$

The throughput model 425, along with the physical dose-based lithographic model 310, is configured to determine the throughput 412 for one or more design variables, such as the pupil shape 405 and mask pattern 406. The throughput model 425 also considers properties 411 of the lithographic apparatus, such as source power, illumination efficiency, etc., in determining the throughput 412. In some embodiments, the physical dose-based lithographic model 310 and the throughput model 425 are collectively referred to as the TPT lithographic model 450. In some embodiments, since the TPT lithographic model 450 includes both the physical dose-based lithographic model 310 and the throughput model 425, it can be used to optimize the patterning process for both the imaging quality and throughput, as described at least with reference to FIGS. 7A and 7B below.

Figure 5:
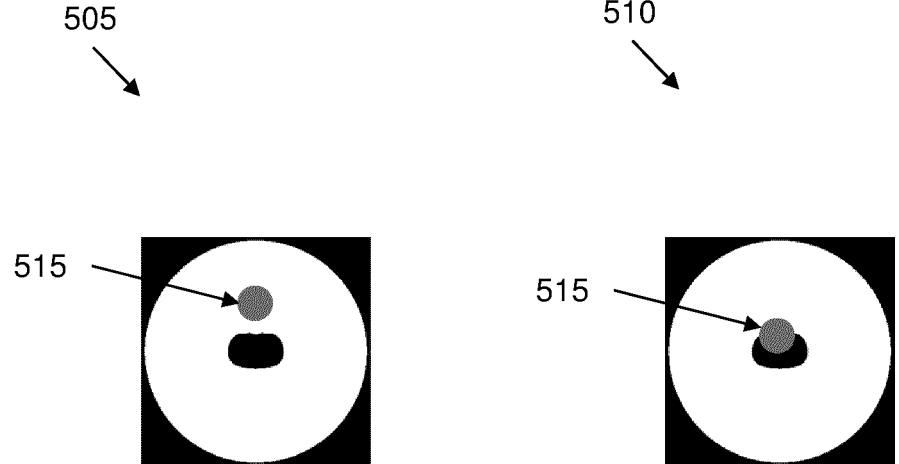
FIG. 5 shows examples of obscured and unobscured pupils, in accordance with one or more embodiments.

FIG. 5 shows examples of obscured and unobscured pupils, in accordance with one or more embodiments. The example 505 shows a pupil 515, which may be similar to pupil 20A of FIG. 1, without any obscuration. The example 510 shows the pupil 515 with obscuration. When there is obscuration, the dose received at the wafer decreases as the radiation passes through the obscured pupil 515, which necessitates the wafer to be exposed for a longer time, thereby resulting in a reduced throughput 412. Accordingly, when there is obscuration, a throughput 412 determined based on the physical dose 410 may not be accurate.

In some embodiments, the TPT lithographic model 450 may use a full transmission dose to determine the throughput when there is pupil obscuration. The throughput, TPT, determined based on the full transmission dose, ftd, may be expressed as:

$$TPT = f(ftd, \text{lithographic apparatus properties}) \qquad \text{Eq. (1E)}$$

In some embodiments, the full transmission dose may be determined as a function of the physical dose and a projection efficiency, which is a function of a source map and pupil transmission associated with the illumination source. For example, the full transmission dose may be computed as follows. According to energy conservation:

$$\int T(\sigma)S(\sigma)d\sigma = \text{dose} * \text{field\_size} \qquad \text{Eq. (1F)}$$

$$\int S(\sigma)d\sigma = ftd * \text{field\_size} \qquad \text{Eq. (1G)}$$

From equations (1F) and (1G):

$$ftd = \text{dose} * \frac{\int S(\sigma)d\sigma}{\int T(\sigma)S(\sigma)d\sigma} = \frac{\text{dose}}{PE} \qquad \text{Eq. (1H)}$$

$$PE = \frac{\int T(\sigma)S(\sigma)d\sigma}{\int S(\sigma)d\sigma} \qquad \text{Eq. (1I)}$$

where PE is projection efficiency, $S(\sigma)$ is the source map, $T(\sigma)$ is the pupil transmission.

Figure 6A:
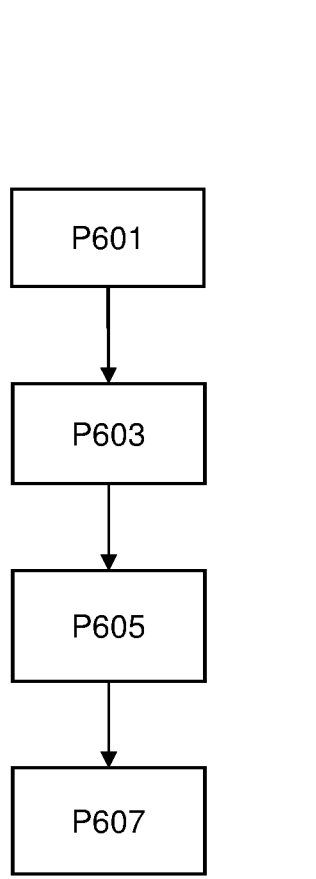
FIG. 6A is a flow diagram of a process for determining a throughput of the patterning process based on a full transmission dose, in accordance with one or more embodiments.
Figure 6B:
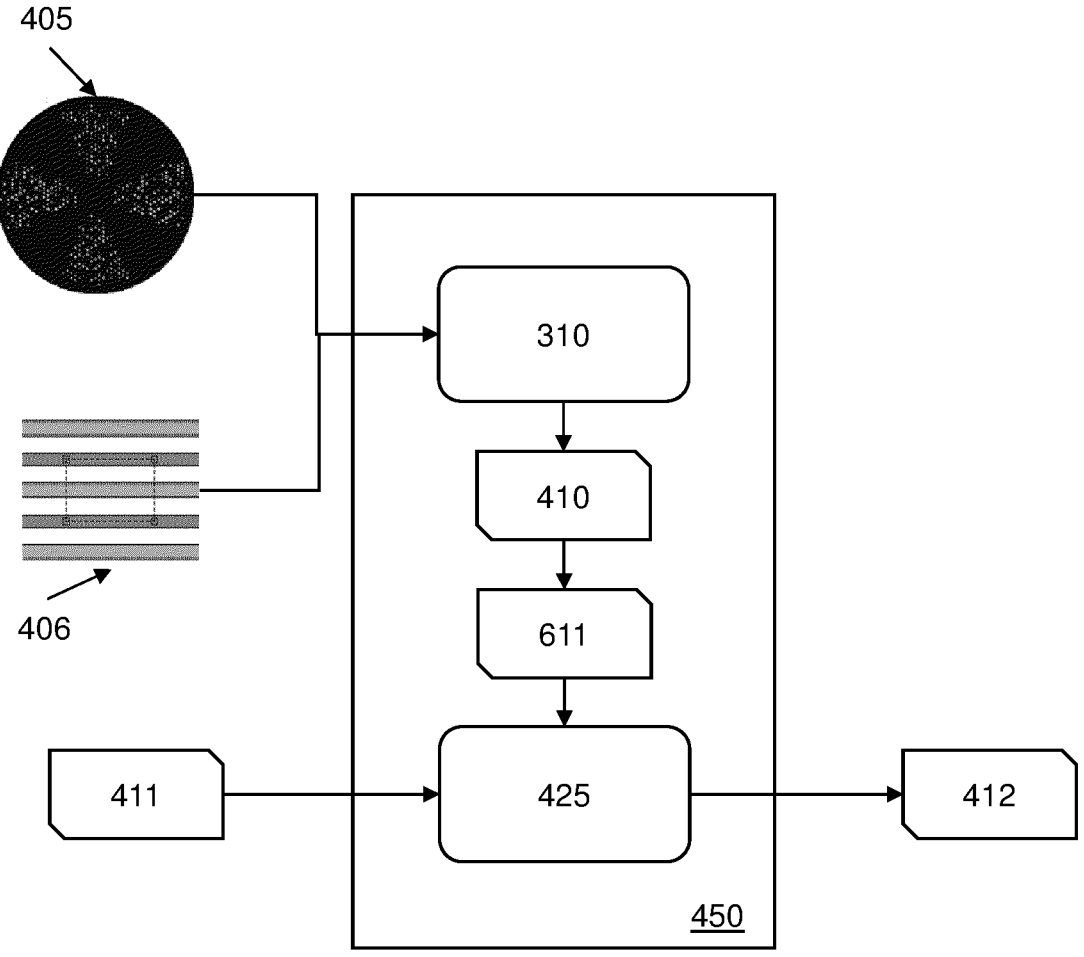
FIG. 6B illustrates another operation of the TPT lithographic model, in accordance with one or more embodiments.

FIG. 6A is a flow diagram of a process 600 for determining a throughput of the patterning process based on the full transmission dose, in accordance with one or more embodiments. The process 600 is described in relation to FIG. 6B, which illustrates operation of the TPT lithographic model 450, in accordance with one or more embodiments. In some embodiments, some of the operations are similar to the process 400 of FIG. 4A and therefore the description of such operations is kept brief for the sake of convenience.

At operation P601, design variables of the patterning process, such as the pupil shape 405 and mask pattern 406 are obtained (e.g., as user input).

At operation P603, a physical dose 410 is obtained from the physical dose-based lithographic model 310, e.g., as described at least with reference to process 400.

At operation P605, a full transmission dose 611 is computed as a function of the physical dose 410. In some embodiments, the full transmission dose 611 is computed from the physical dose 410 using the equations (1H) and (1I) mentioned above.

At operation P607, the throughput 412 of the patterning process is determined based on the full transmission dose 611. In some embodiments, the throughput model 425, along with the physical dose-based lithographic model 310, is configured to determine the throughput 412 for the pupil shape 405 and mask pattern 406. The throughput model 425 also considers properties 411 of the lithographic apparatus, such as source power, illumination efficiency, etc., in determining the throughput 412.

The full transmission dose 611 may be computed in various ways. For example, the full transmission dose 611 may be computed as a function of the physical dose 410 and the projection efficiency as described above. In another example, the full transmission dose 611 may be determined by removing obscuration or apodization of the pupil 515 from the physical dose-based lithographic model 310 and then determining it as a function of the dose received at the wafer through an open-frame mask, which is described below at least with reference to FIGS. 7A and 7B.

Figure 7A:
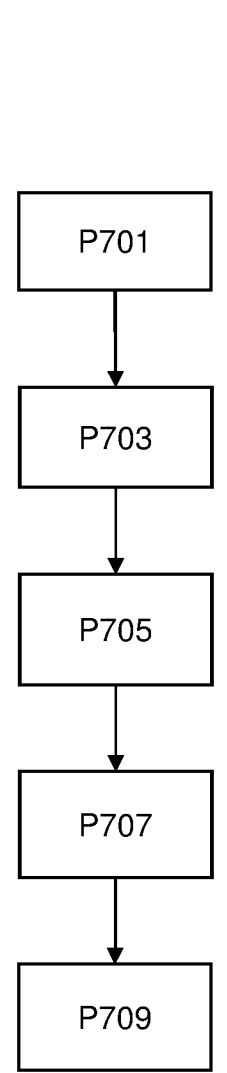
FIG. 7A is a flow diagram of a process for determining a throughput of the patterning process based on the full transmission dose, in accordance with one or more embodiments.
Figure 7B:
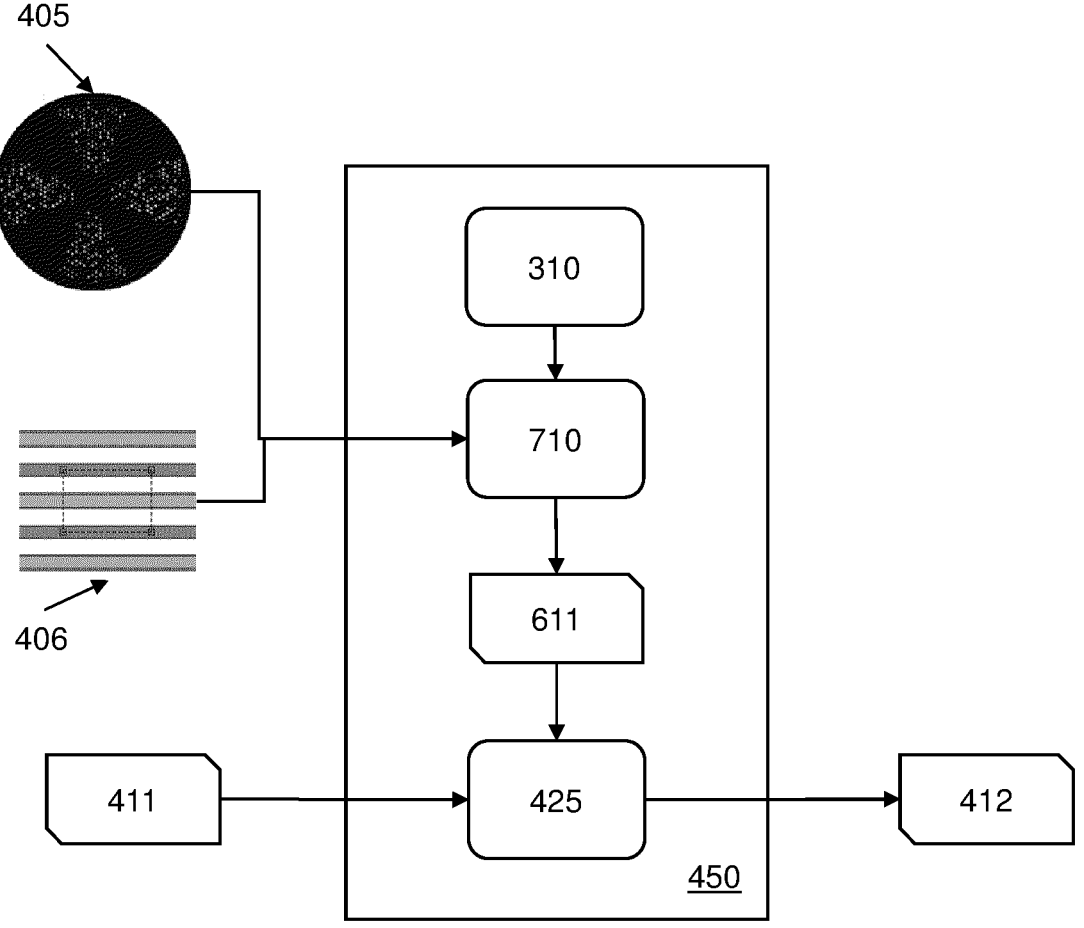
FIG. 7B illustrates another operation of the TPT lithographic model, in accordance with one or more embodiments.

FIG. 7A is a flow diagram of a process 700 for determining a throughput of the patterning process based on the full transmission dose, in accordance with one or more embodiments. The process 600 is described in relation to FIG. 7B, which illustrates operation of the TPT lithographic model 450, in accordance with one or more embodiments. In some embodiments, some of the operations are similar to the processes 400 or 600 of FIG. 4A or 6A and therefore the description of such operations is kept brief for the sake of convenience.

At operation P701, design variables of the patterning process, such as the pupil shape 405 and mask pattern 406 are obtained (e.g., as user input).

At operation P703, the physical dose-based lithographic model 310 is obtained.

At operation P705, the obscuration and apodization is removed from the physical dose-based lithographic model 310 to generate an unobscured physical dose-based lithographic model 710. In some embodiments, removing the obscuration or apodization may involve replacing the realistic pupil function P($\sigma$) with (a) a constant magnitude of 1 within the numerical aperture (NA), and (b) 0 outside the NA.

At operation P707, the full transmission dose 611 is obtained from the unobscured physical dose-based lithographic model 710. In some embodiments, the full transmission dose 611 is obtained as a function of the dose2clear 315 and the exposure margin 313 values from the unobscured physical dose-based lithographic model 710. For example, the full transmission dose 611, is obtained as a product of the dose2clear 315 and the exposure margin 313 values, which may be represented as:

$$ftd = d2c * \alpha \qquad \text{Eq. (1J)}$$

At operation P709, the throughput 412 of the patterning process is determined based on the full transmission dose 611. In some embodiments, the throughput model 425, along with the unobscured physical dose-based lithographic model 710, determines the throughput 412 for a given pupil shape 405 and mask pattern 406. The throughput model 425 also considers properties 411 of the lithographic apparatus, such as source power, illumination efficiency, etc., in determining the throughput 412.

As described above, the TPT lithographic model 450 may be used to determine the throughput 412 of a patterning process. The TPT lithographic model 450 may also be used to optimize the throughput 412 and imaging quality of the patterning process.

Figure 8A:
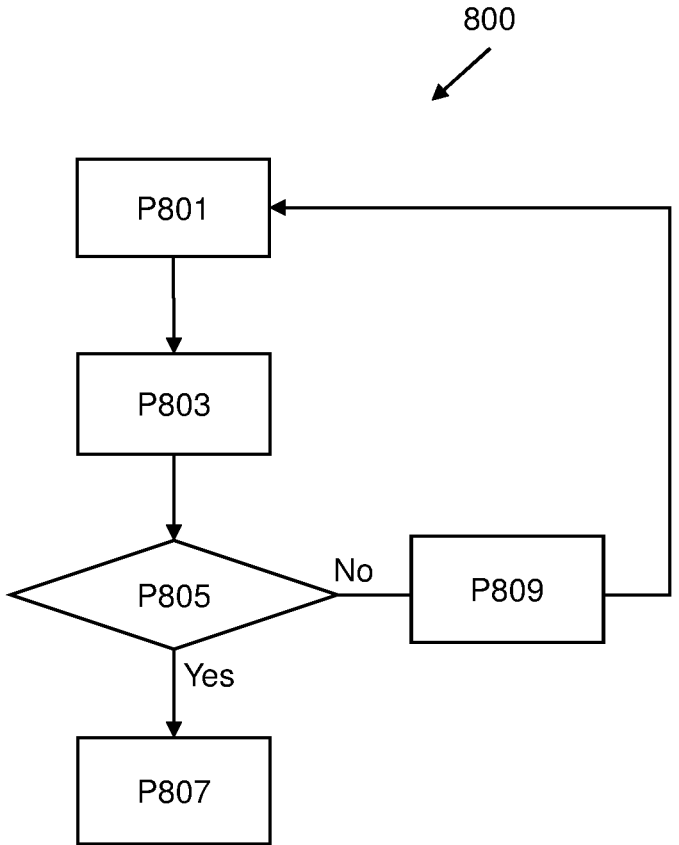
FIG. 8A is a flow diagram of a process for optimizing a throughput and imaging quality of the patterning process, in accordance with one or more embodiments.
Figure 8B:
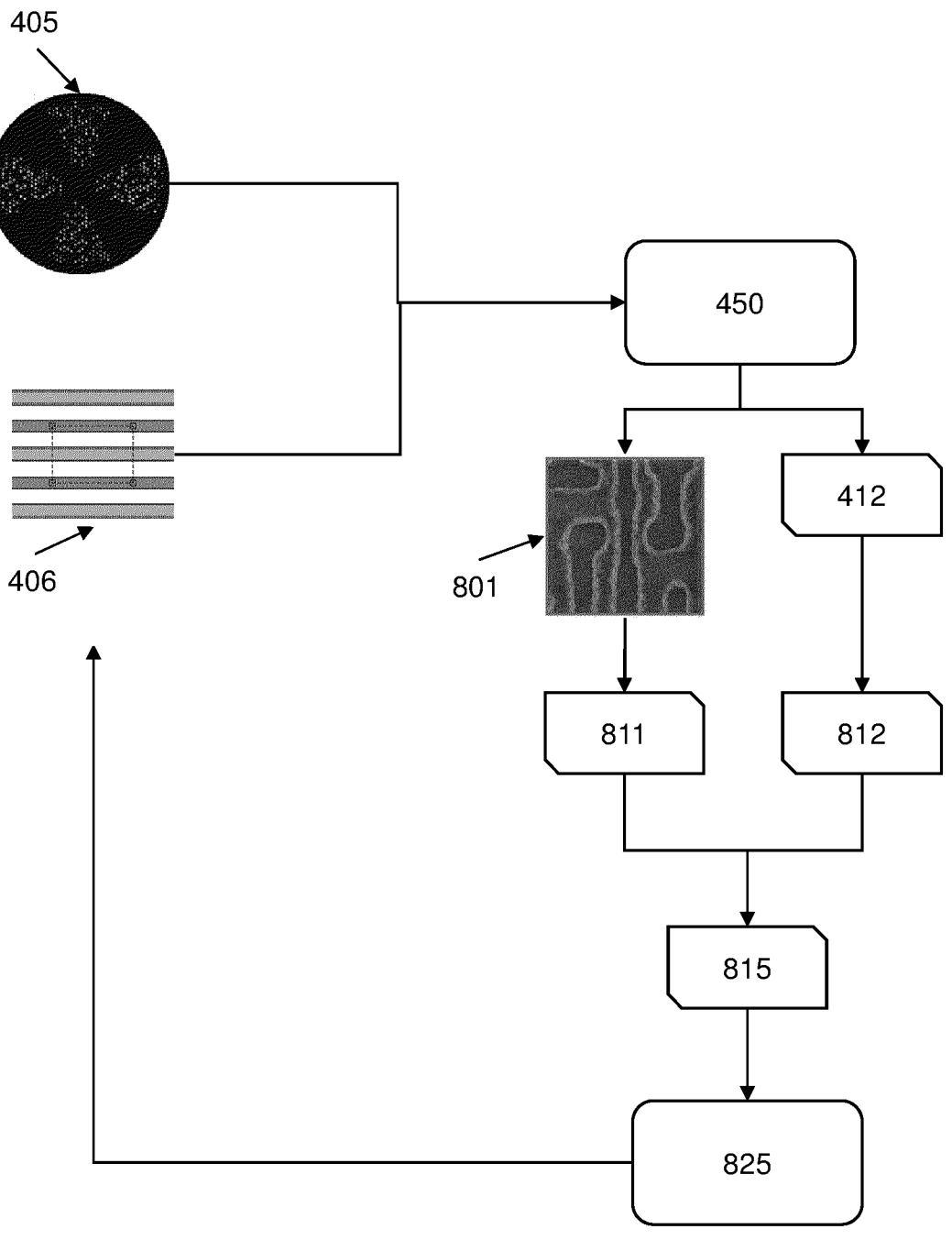
FIG. 8B illustrates an operation of an optimizer, in accordance with one or more embodiments.

FIG. 8A is a flow diagram of a process 800 for optimizing a throughput and imaging quality of the patterning process, in accordance with one or more embodiments. The process 800 is described in relation to FIG. 8B, which illustrates an operation of an optimizer 825, in accordance with one or more embodiments.

At operation P801, an imaging quality 801 and the throughput 412 are determined using the TPT lithographic model 450 for a given pupil shape 405 and mask pattern 406. In some embodiments, the throughput 412 is determined based on the physical dose 410 or the full transmission dose 611 as described at least with reference to FIGS. 4A-7B. In some embodiments, the imaging quality 801 may be determined using lithographic model 305 (or the physical dose-based lithographic model 310 or the unobscured physical dose-based lithographic model 710), as described at least with reference to FIG. 2 above and FIGS. 11-14 below. In some embodiments, the imaging quality may be quantified using various metrics, such as edge placement errors, aerial image intensity slopes, CDs, depth of focus, image contrast, resist contours, etc. For example, edge placement error (EPE) can simply be a distance between a point in the resist image to an intended position of that point.

At operation P803, a multi-variable cost function 815 is computed. In some embodiments, optimizing both the throughput 412 and the imaging quality 801 may include optimizing the multi-variable cost function 815. The multi-variable cost function 815, S, may include imaging quality-based cost function 811, $S_{imaging}$, and a throughput-based cost function 812, $S_{TPT}$. The multi-variable cost function 815 may be expressed as:

$$S = S_{imaging} + S_{TPT} \qquad \text{Eq. (1K)}$$

The throughput-based cost function 812 may be expressed in various ways. One such throughput-based cost function 812 may be indicative of a difference between a desired throughput and a determined throughput, which may be expressed as follows:

$$S_{TPT} = \begin{cases} w*(TPT_{thres} - TPT)^3, & \text{if } TPT < TPT_{thres} \\ 0, & \text{otherwise} \end{cases} \qquad \text{Eq. (1L)}$$

Where w is the weight factor, $TPT_{thres}$ is the desired throughput, and TPT is the throughput 412. In some embodiments, the weight factor may be used to balance emphasis on optimizing one factor over the other. For example, the higher the value of w, the higher the emphasis on optimizing throughput 412 over imaging quality 801.

The imaging quality-based cost function 811 may depend on the metric considered for optimization. For example, if the metric is EPE, then the imaging quality-based cost function 811 may be expressed as follows:

$$s_{imaging} = \sum_{i,pw} w_i epe_i^p \qquad \text{Eq. (1M)}$$

Where pw is process windows conditions and epe is edge placement error.

After computing the multi-variable cost function 815, at operation P805, an optimizer 825 determines whether the multi-variable cost function 815 is optimized (e.g., minimized). If the optimizer 825 determines that the multi-variable cost function 815 is optimized, at operation P807, the TPT lithographic model 450 may output the values of the design variables, e.g., the updated pupil shape 405 and mask pattern 406, to be used in a patterning process for printing a design layout onto a substrate for obtaining the optimized throughput 412 and imaging quality 801. If the optimizer 825 determines that the multi-variable cost function 815 is not optimized, the process 800 proceeds with operation P809 to continue with optimizing the multi-variable cost function 815.

At operation P809, the optimizer 825 may reconfigure the characteristics of the patterning process by updating one or more of the design variables, such as the pupil shape 405 or mask pattern 406, to optimize the multi-variable cost function 815. In some embodiments, optimizing the throughput 412 may mean increasing the throughput 412, that is, increasing the wafers printed per hour. Such on optimization of the throughput 412 may be realized by minimizing the throughput-based cost function 812.

In some embodiments, optimizing the imaging quality 801 may be dependent on the imaging quality metric being optimized. For example, with respect to imaging quality metric such as EPE, optimizing the imaging quality 801 may mean minimizing the EPE. Such on optimization of the throughput 412 may be realized by minimizing the imaging quality-based cost function 811.

Accordingly, the optimizer 825 may update the pupil shape 405 or mask pattern 406 to minimize the multi-variable cost function 815, which includes minimizing the imaging quality-based cost function 811 and minimizing the throughput-based cost function 812. In some embodiments, updating the pupil shape 405 may include updating one or more pixels of the pupil shape 405. In some embodiments, updating the mask pattern 406 may include adjusting a pattern (e.g., updating the structure of pattern such as the position of one or more polygon edges).

The process 800 proceeds to operation P801 and may continue until the multi-variable cost function 815 is minimized (e.g., a predefined number of iterations, the multi-variable cost function 815 is less than a specified threshold, or such other conditions).

While the foregoing example describes optimizing the multi-variable cost function 815 as minimizing the multi-variable cost function 815, in some embodiments, optimizing the multi-variable cost function 815 may include maximizing the multi-variable cost function 815.

Figure 8C:
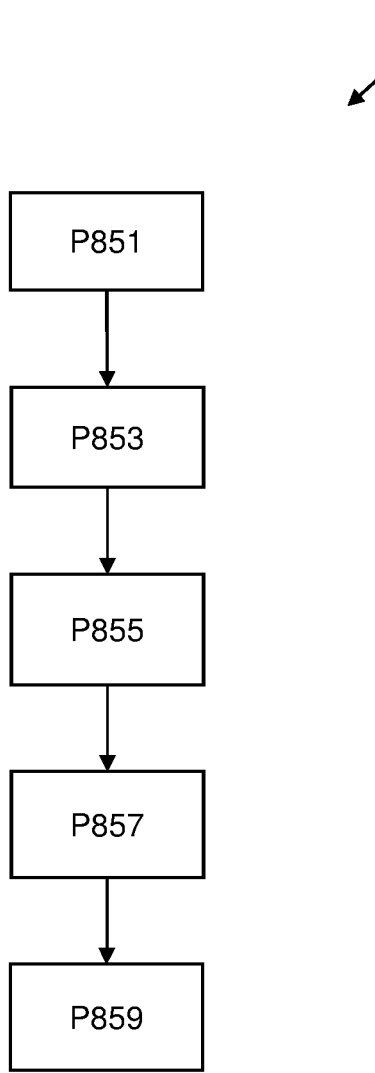
FIG. 8C is a flow diagram of a process for optimizing a throughput and imaging quality of the patterning process, in accordance with one or more embodiments.

FIG. 8C is a flow diagram of a process 850 for optimizing a throughput and imaging quality of the patterning process, in accordance with one or more embodiments.

At operation P851, a physical dose of a lithographic apparatus is obtained. In some embodiments, the physical dose 410 is obtained as described at least with reference to FIGS. 3-4B.

At operation P853, the physical dose is input to a lithographic model such as the TPT lithographic model 450. In some embodiments, design variables of the lithographic apparatus, such as the pupil shape 405 and mask pattern 406 are also input to the TPT lithographic model 450 along with the physical dose 410.

At operation P855, a multi-variable cost function 815 is computed using the physical dose and the other design variables input. In some embodiments, the multi-variable cost function 815 is computed using the Eq. 1K-1M mentioned above. For example, the multi-variable cost function, S, may include imaging quality-based cost function 811, $S_{imaging}$, and a throughput-based cost function 812, $S_{TPT}$. The throughput-based cost function 812, which is computed using Eq. 1L, is determined based on the throughput, which is determined using Eq. (1D) or (1E) as described at least with reference to FIG. 4A-6B. The imaging quality-based cost function 811 may depend on the metric considered for optimization, which is computed using Eq. (1M).

After computing the multi-variable cost function 815, the design variables, such as the pupil shape 405 and the mask pattern 406 are adjusted, until a predefined termination condition is satisfied. In some embodiments, the termination condition is satisfied when the multi-variable cost function 815 is optimized (e.g., minimized or maximized as described at least with reference to FIG. 8A).

Upon the multi-variable cost function 815 being optimized, at operation P857, the TPT lithographic model 450 may output the adjusted values of the design variables, e.g., the updated pupil shape 405 and the updated mask pattern 406, to be used in a patterning process for printing a design layout onto a substrate for obtaining the optimized throughput 412 and imaging quality 801.

At operation P859, the TPT lithographic model 450 may display the output on a user interface, e.g., in a graphical user interface of a computer system.

Figure 9:
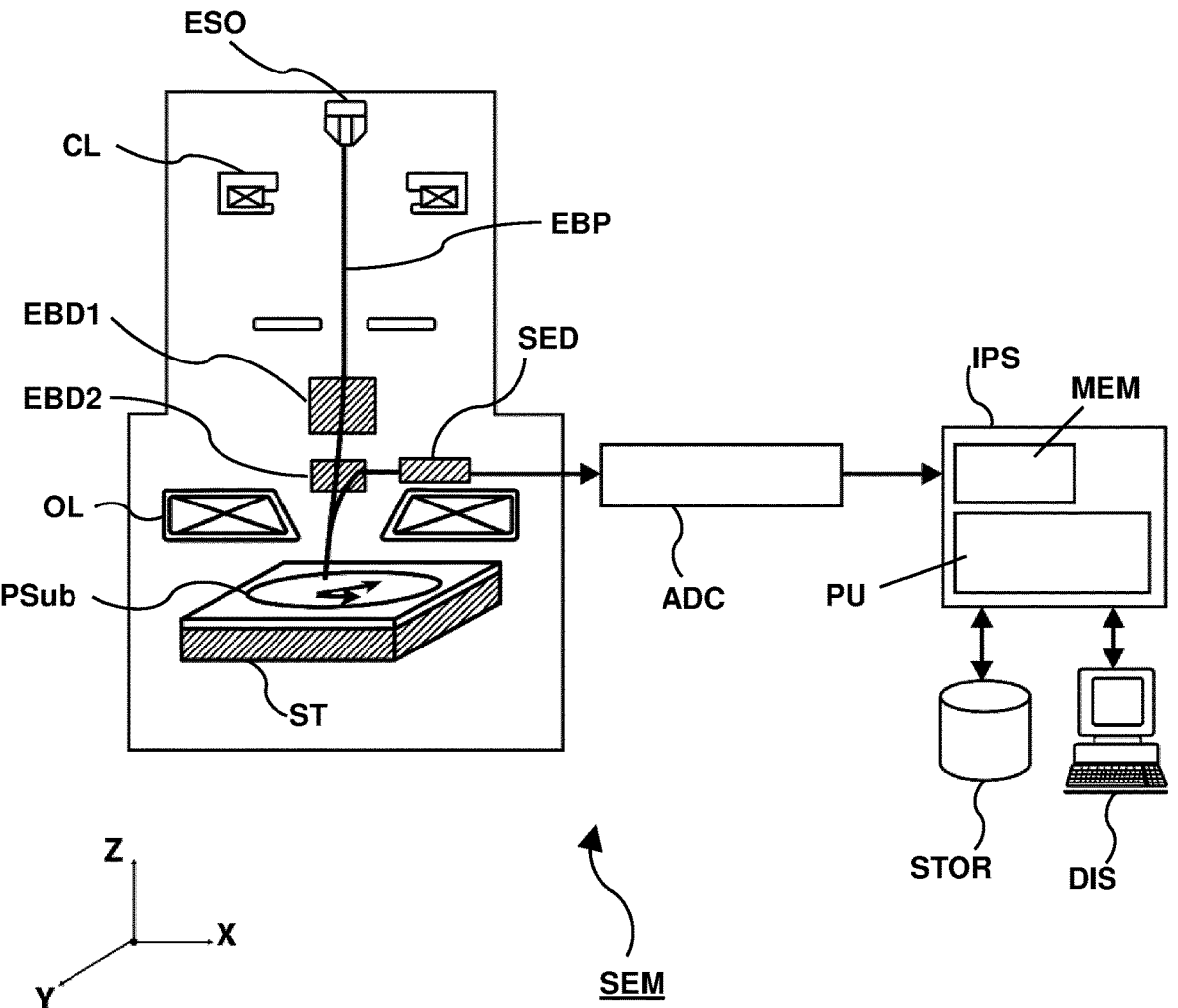
FIG. 9 schematically depicts an embodiment of a scanning electron microscope (SEM), according to an embodiment.

In some embodiments, the inspection apparatus may be a scanning electron microscope (SEM) that yields an image of a structure (e.g., some or all the structure of a device) exposed or transferred on the substrate. FIG. 9 depicts an embodiment of a SEM tool. A primary electron beam EBP emitted from an electron source ESO is converged by condenser lens CL and then passes through a beam deflector EBD1, an E×B deflector EBD2, and an objective lens OL to irradiate a substrate PSub on a substrate table ST at a focus.

When the substrate PSub is irradiated with electron beam EBP, secondary electrons are generated from the substrate PSub. The secondary electrons are deflected by the E×B deflector EBD2 and detected by a secondary electron detector SED. A two-dimensional electron beam image can be obtained by detecting the electrons generated from the sample in synchronization with, e.g., two dimensional scanning of the electron beam by beam deflector EBD1 or with repetitive scanning of electron beam EBP by beam deflector EBD1 in an X or Y direction, together with continuous movement of the substrate PSub by the substrate table ST in the other of the X or Y direction.

A signal detected by secondary electron detector SED is converted to a digital signal by an analog/digital (A/D) converter ADC, and the digital signal is sent to an image processing system IPU. In an embodiment, the image processing system IPU may have memory MEM to store all or part of digital images for processing by a processing unit PU. The processing unit PU (e.g., specially designed hardware or a combination of hardware and software) is configured to convert or process the digital images into datasets representative of the digital images. Further, image processing system IPU may have a storage medium STOR configured to store the digital images and corresponding datasets in a reference database. A display device DIS may be connected with the image processing system IPU, so that an operator can conduct necessary operation of the equipment with the help of a graphical user interface.

Figure 10:
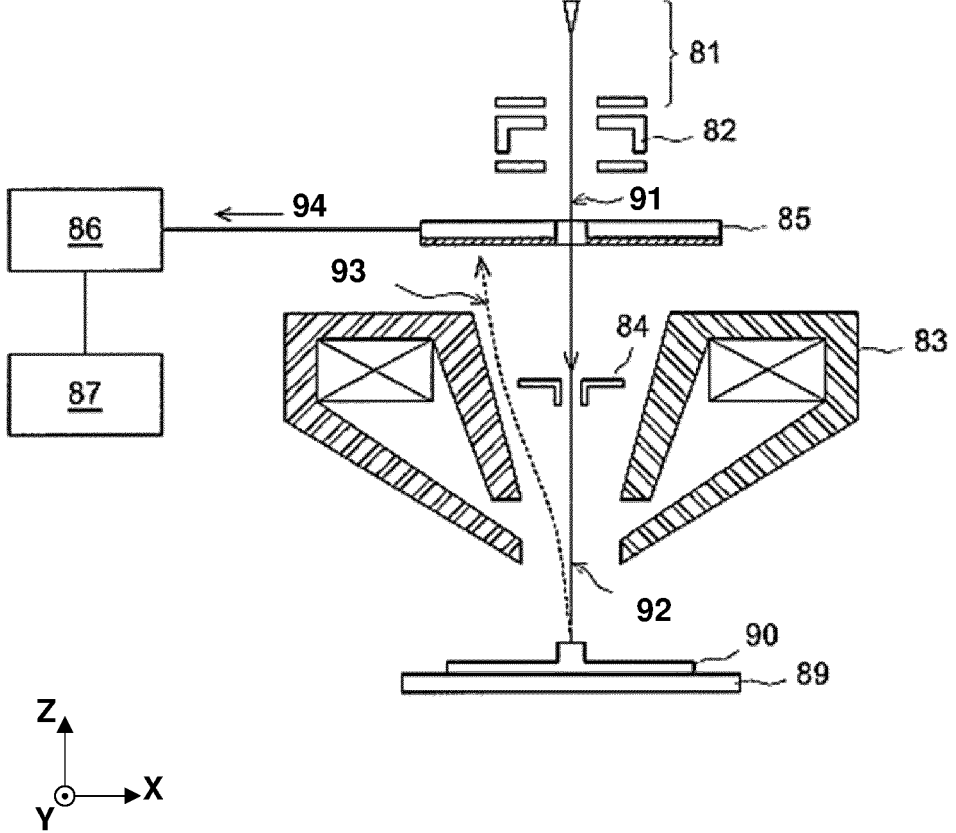
FIG. 10 schematically depicts an embodiment of an electron beam inspection apparatus, according to an embodiment.

FIG. 10 schematically illustrates a further embodiment of an inspection apparatus. The system is used to inspect a sample 90 (such as a substrate) on a sample stage 89 and comprises a charged particle beam generator 81, a condenser lens module 82, a probe forming objective lens module 83, a charged particle beam deflection module 84, a secondary charged particle detector module 85, and an image forming module 86.

The charged particle beam generator 81 generates a primary charged particle beam 91. The condenser lens module 82 condenses the generated primary charged particle beam 91. The probe forming objective lens module 83 focuses the condensed primary charged particle beam into a charged particle beam probe 92. The charged particle beam deflection module 84 scans the formed charged particle beam probe 92 across the surface of an area of interest on the sample 90 secured on the sample stage 89. In an embodiment, the charged particle beam generator 81, the condenser lens module 82 and the probe forming objective lens module 83, or their equivalent designs, alternatives or any combination thereof, together form a charged particle beam probe generator which generates the scanning charged particle beam probe 92.

The secondary charged particle detector module 85 detects secondary charged particles 93 emitted from the sample surface (maybe also along with other reflected or scattered charged particles from the sample surface) upon being bombarded by the charged particle beam probe 92 to generate a secondary charged particle detection signal 94. The image forming module 86 (e.g., a computing device) is coupled with the secondary charged particle detector module 85 to receive the secondary charged particle detection signal 94 from the secondary charged particle detector module 85 and accordingly forming at least one scanned image. In an embodiment, the secondary charged particle detector module 85 and image forming module 86, or their equivalent designs, alternatives or any combination thereof, together form an image forming apparatus which forms a scanned image from detected secondary charged particles emitted from sample 90 being bombarded by the charged particle beam probe 92.

As noted above, SEM images may be processed to extract contours that describe the edges of objects, representing device structures, in the image. These contours are then quantified via metrics, such as CD. Thus, typically, the images of device structures are compared and quantified via simplistic metrics, such as an edge-to-edge distance (CD) or simple pixel differences between images. Typical contour models that detect the edges of the objects in an image in order to measure CD use image gradients. Indeed, those models rely on strong image gradients. But, in practice, the image typically is noisy and has discontinuous boundaries. Techniques, such as smoothing, adaptive thresholding, edge-detection, erosion, and dilation, may be used to process the results of the image gradient contour models to address noisy and discontinuous images, but will ultimately result in a low-resolution quantification of a high-resolution image. Thus, in most instances, mathematical manipulation of images of device structures to reduce noise and automate edge detection results in loss of resolution of the image, thereby resulting in loss of information. Consequently, the result is a low-resolution quantification that amounts to a simplistic representation of a complicated, high-resolution structure.

So, it is desirable to have a mathematical representation of the structures (e.g., circuit features, alignment mark or metrology target portions (e.g., grating features), etc.) produced or expected to be produced using a patterning process, whether, e.g., the structures are in a latent resist image, in a developed resist image or transferred to a layer on the substrate, e.g., by etching, that can preserve the resolution and yet describe the general shape of the structures. In the context of lithography or other pattering processes, the structure may be a device or a portion thereof that is being manufactured and the images may be SEM images of the structure. In some instances, the structure may be a feature of semiconductor device, e.g., integrated circuit. In some instances, the structure may be an alignment mark, or a portion thereof (e.g., a grating of the alignment mark), that is used in an alignment measurement process to determine alignment of an object (e.g., a substrate) with another object (e.g., a patterning device) or a metrology target, or a portion thereof (e.g., a grating of the metrology target), that is used to measure a parameter (e.g., overlay, focus, dose, etc.) of the patterning process. In an embodiment, the metrology target is a diffractive grating used to measure, e.g., overlay.

In an embodiment, the measurement data (e.g., stochastic variations) related to the printed pattern, determined according to the method of FIG. 3, may be employed in optimization of patterning process or adjusting parameters of the patterning process. As an example, OPC addresses the fact that the final size and placement of an image of the design layout projected on the substrate will not be identical to, or simply depend only on the size and placement of the design layout on the patterning device. It is noted that the terms "mask", "reticle", "patterning device" are utilized interchangeably herein. Also, person skilled in the art will recognize that, especially in the context of lithography simulation/optimization, the term "mask"/"patterning device" and "design layout" can be used interchangeably, as in lithography simulation/optimization, a physical patterning device is not necessarily used but a design layout can be used to represent a physical patterning device. For the small feature sizes and high feature densities present on some design layout, the position of a particular edge of a given feature will be influenced to a certain extent by the presence or absence of other adjacent features. These proximity effects arise from minute amounts of radiation coupled from one feature to another and/or non-geometrical optical effects such as diffraction and interference. Similarly, proximity effects may arise from diffusion and other chemical effects during post-exposure bake (PEB), resist development, and etching that generally follow lithography.

In order to ensure that the projected image of the design layout is in accordance with requirements of a given target circuit design, proximity effects need to be predicted and compensated for, using sophisticated numerical models, corrections or pre-distortions of the design layout. The article "Full-Chip Lithography Simulation and Design Analysis—How OPC Is Changing IC Design", C. Spence, Proc. SPIE, Vol. 5751, pp 1-14 (2005) provides an overview of current "model-based" optical proximity correction processes. In a typical high-end design almost every feature of the design layout has some modification in order to achieve high fidelity of the projected image to the target design. These modifications may include shifting or biasing of edge positions or line widths as well as application of "assist" features that are intended to assist projection of other features.

Application of model-based OPC to a target design involves good process models and considerable computational resources, given the many millions of features typically present in a chip design. However, applying OPC is generally not an "exact science", but an empirical, iterative process that does not always compensate for all possible proximity effect. Therefore, effect of OPC, e.g., design layouts after application of OPC and any other RET, need to be verified by design inspection, i.e. intensive full-chip simulation using calibrated numerical process models, in order to minimize the possibility of design flaws being built into the patterning device pattern. This is driven by the enormous cost of making high-end patterning devices, which run in the multi-million dollar range, as well as by the impact on turn-around time by reworking or repairing actual patterning devices once they have been manufactured.

Both OPC and full-chip RET verification may be based on numerical modeling systems and methods as described, for example in, U.S. patent application Ser. No. 10/815,573 and an article titled "Optimized Hardware and Software For Fast, Full Chip Simulation", by Y. Cao et al., Proc. SPIE, Vol. 5754, 405 (2005).

One RET is related to adjustment of the global bias of the design layout. The global bias is the difference between the patterns in the design layout and the patterns intended to print on the substrate. For example, a circular pattern of 25 nm diameter may be printed on the substrate by a 50 nm diameter pattern in the design layout or by a 20 nm diameter pattern in the design layout but with high dose.

In addition to optimization to design layouts or patterning devices (e.g., OPC), the illumination source can also be optimized, either jointly with patterning device optimization or separately, in an effort to improve the overall lithography fidelity. The terms "illumination source" and "source" are used interchangeably in this document. Since the 1990s, many off-axis illumination sources, such as annular, quadrupole, and dipole, have been introduced, and have provided more freedom for OPC design, thereby improving the imaging results, As is known, off-axis illumination is a proven way to resolve fine structures (i.e., target features) contained in the patterning device. However, when compared to a traditional illumination source, an off-axis illumination source usually provides less radiation intensity for the aerial image (AI). Thus, it becomes desirable to attempt to optimize the illumination source to achieve the optimal balance between finer resolution and reduced radiation intensity.

Numerous illumination source optimization approaches can be found, for example, in an article by Rosenbluth et al., titled "Optimum Mask and Source Patterns to Print A Given Shape", Journal of Microlithography, Microfabrication, Microsystems 1(1), pp. 13-20, (2002). The source is partitioned into several regions, each of which corresponds to a certain region of the pupil spectrum. Then, the source distribution is assumed to be uniform in each source region and the brightness of each region is optimized for process window. However, such an assumption that the source distribution is uniform in each source region is not always valid, and as a result the effectiveness of this approach suffers. In another example set forth in an article by Granik, titled "Source Optimization for Image Fidelity and Throughput", Journal of Microlithography, Microfabrication, Microsystems 3(4), pp. 509-522, (2004), several existing source optimization approaches are overviewed and a method based on illuminator pixels is proposed that converts the source optimization problem into a series of non-negative least square optimizations. Though these methods have demonstrated some successes, they typically require multiple complicated iterations to converge. In addition, it may be difficult to determine the appropriate/optimal values for some extra parameters, such as y in Granik's method, which dictates the trade-off between optimizing the source for substrate image fidelity and the smoothness requirement of the source.

For low $k_1$ photolithography, optimization of both the source and patterning device is useful to ensure a viable process window for projection of critical circuit patterns. Some algorithms (e.g. Socha et. al. Proc. SPIE vol. 5853, 2005, p. 180) discretize illumination into independent source points and mask into diffraction orders in the spatial frequency domain, and separately formulate a cost function (which is defined as a function of selected design variables) based on process window metrics such as exposure latitude which could be predicted by optical imaging models from source point intensities and patterning device diffraction orders. The term "design variables" as used herein comprises a set of parameters of a lithographic projection apparatus or a patterning process, for example, parameters a user of the lithographic projection apparatus can adjust, or image characteristics a user can adjust by adjusting those parameters. It should be appreciated that any characteristics of a lithographic projection process, including those of the source, the patterning device, the projection optics, and/or resist characteristics can be among the design variables in the optimization. The cost function is often a non-linear function of the design variables. Then standard optimization techniques are used to minimize the cost function.

Relatedly, the pressure of ever decreasing design rules have driven semiconductor chipmakers to move deeper into the low $k_1$ lithography era with existing 193 nm ArF lithography. Lithography towards lower $k_1$ puts heavy demands on RET, exposure tools, and the need for litho-friendly design. 1.35 ArF hyper numerical aperture (NA) exposure tools may be used in the future. To help ensure that circuit design can be produced on to the substrate with workable process window, source-patterning device optimization (referred to herein as source-mask optimization or SMO) is becoming a significant RET for 2×nm node.

A source and patterning device (design layout) optimization method and system that allows for simultaneous optimization of the source and patterning device using a cost function without constraints and within a practicable amount of time is described in a commonly assigned International Patent Application No. PCT/US2009/065359, filed on Nov. 20, 2009, and published as WO2010/059954, titled "Fast Freeform Source and Mask Co-Optimization Method", which is hereby incorporated by reference in its entirety.

Another source and mask optimization method and system that involves optimizing the source by adjusting pixels of the source is described in a commonly assigned U.S. patent application Ser. No. 12/813,456, filed on Jun. 10, 2010, and published as U.S. Patent Application Publication No. 2010/0315614, titled "Source-Mask Optimization in Lithographic Apparatus", which is hereby incorporated by reference in its entirety.

In a lithographic projection apparatus, as an example, a cost function is expressed as wherein $(z_1, z_2, \ldots, z_N)$ are N design variables or values thereof. $f_p(z_1, z_2, \ldots, z_N)$ can be a function of the design variables $(z_1, z_2, \ldots, z_N)$ such as a difference between an actual value and an intended value of a characteristic at an evaluation point for a set of values of the design variables of $(z_1, z_2, \ldots, z_N)$. $w_p$ is a weight constant associated with $f_p(z_1, z_2, \ldots, z_N)$. An evaluation point or pattern more critical than others can be assigned a higher $w_p$ value. Patterns and/or evaluation points with larger number of occurrences may be assigned a higher $w_p$ value, too. Examples of the evaluation points can be any physical point or pattern on the substrate, any point on a virtual design layout, or resist image, or aerial image, or a combination thereof. $f_p(z_1, z_2, \ldots, z_N)$ can also be a function of one or more stochastic effects such as the LWR, which are functions of the design variables $(z_1, z_2, \ldots, z_N)$. The cost function may represent any suitable characteristics of the lithographic projection apparatus or the substrate, for instance, failure rate of a feature, focus, CD, image shift, image distortion, image rotation, stochastic effects, throughput, CDU, or a combination thereof. CDU is local CD variation (e.g., three times of the standard deviation of the local CD distribution). CDU may be interchangeably referred to as LCDU. In one embodiment, the cost function represents (i.e., is a function of) CDU, throughput, and the stochastic effects. In one embodiment, the cost function represents (i.e., is a function of) EPE, throughput, and the stochastic effects. In one embodiment, the design variables $(z_1, z_2, \ldots, z_N)$ comprise dose, global bias of the patterning device, shape of illumination from the source, or a combination thereof. Since it is the resist image that often dictates the circuit pattern on a substrate, the cost function often includes functions that represent some characteristics of the resist image. For example, $f_p(z_1, z_2, \ldots, z_N)$ of such an evaluation point can be simply a distance between a point in the resist image to an intended position of that point (i.e., edge placement error $EPE_p(z_1, z_2, \ldots, z_N)$). The design variables can be any adjustable parameters such as adjustable parameters of the source, the patterning device, the projection optics, dose, focus, etc. The projection optics may include components collectively called as "wavefront manipulator" that can be used to adjust shapes of a wavefront and intensity distribution and/or phase shift of the irradiation beam. The projection optics preferably can adjust a wavefront and intensity distribution at any location along an optical path of the lithographic projection apparatus, such as before the patterning device, near a pupil plane, near an image plane, near a focal plane. The projection optics can be used to correct or compensate for certain distortions of the wavefront and intensity distribution caused by, for example, the source, the patterning device, temperature variation in the lithographic projection apparatus, thermal expansion of components of the lithographic projection apparatus. Adjusting the wavefront and intensity distribution can change values of the evaluation points and the cost function. Such changes can be simulated from a model or actually measured. Of course, $CF(z_1, z_2, \ldots, z_N)$ is not limited the form in Eq. 1. CF $(z_1, z_2, \ldots, z_N)$ can be in any other suitable form.

It should be noted that the normal weighted root mean square (RMS) of $f_p(z_1, z_2, \ldots, z_N)$ is defined as $$CF(z_1, z_2, \ldots, z_N) = \sum_{p=1}^{P} w_p f_p^2(z_1, z_2, \ldots, z_N) \qquad \text{(Eq. 1)}$$

$$\sqrt{\frac{1}{P}\sum_{p=1}^{P} w_p f_p^2(z_1, z_2, \ldots, z_N)},$$

therefore, minimizing the weighted RMS of $f_p(z_1, z_2, \ldots, z_N)$ is equivalent to minimizing the cost function $$CF(z_1, z_2, \ldots, z_N) = \sum_{p=1}^{P} w_p f_p^2(z_1, z_2, \ldots, z_N),$$

defined in Eq. 1. Thus the weighted RMS of $f_p(z_1, z_2, \ldots, z_N)$ and Eq. 1 may be utilized interchangeably for notational simplicity herein.

Further, if considering maximizing the PW (Process Window), one can consider the same physical location from different PW conditions as different evaluation points in the cost function in (Eq.1). For example, if considering N PW conditions, then one can categorize the evaluation points according to their PW conditions and write the cost functions as:

$$CF(z_1, z_2, \ldots, z_N) =$$
$$\sum_{p=1}^{P} w_p f_p^2(z_1, z_2, \ldots, z_N) \sum_{u=1}^{U} \sum_{p_u=1}^{P_u} w_{p_u} f_{p_u}^2(z_1, z_2, \ldots, z)$$

(Eq. 1')

Where $f_{p_u}(z_1, z_2, \ldots, z_N)$ is the value of $f_p(z_1, z_2, \ldots, z_N)$ under the u-th PW condition u=1, . . . , U. When $f_p(z_1, z_2, \ldots, z_N)$ is the EPE, then minimizing the above cost function is equivalent to minimizing the edge shift under various PW conditions, thus this leads to maximizing the PW. In particular, if the PW also consists of different mask bias, then minimizing the above cost function also includes the minimization of MEEF (Mask Error Enhancement Factor), which is defined as the ratio between the substrate EPE and the induced mask edge bias.

The design variables may have constraints, which can be expressed as $(z_1, z_2, \ldots, z_N) \in Z$, where Z is a set of possible values of the design variables. One possible constraint on the design variables may be imposed by yield or a desired throughput of the lithographic projection apparatus. The desired yield or throughput may limit the dose and thus has implications for the stochastic effects (e.g., imposing a lower bound on the stochastic effects). Higher throughput generally leads to lower dose, shorter longer exposure time and greater stochastic effects. Higher yield generally leads to a restricted design which may be sensitive to stochastic risk. Consideration of substrate throughput, yield and minimization of the stochastic effects may constrain the possible values of the design variables because the stochastic effects are function of the design variables. Without such a constraint imposed by the desired throughput, the optimization may yield a set of values of the design variables that are unrealistic. For example, if the dose is among the design variables, without such a constraint, the optimization may yield a dose value that makes the throughput economically impossible. However, the usefulness of constraints should not be interpreted as a necessity. The throughput may be affected by the failure rate based adjustment to parameters of the patterning process. It is desirable to have lower failure rate of the feature while maintaining a high throughput. Throughput may also be affected by the resist chemistry. Slower resist (e.g., a resist that requires higher amount of light to be properly exposed) leads to lower throughput. Thus, based on the optimization process involving failure rate of a feature due to resist chemistry or fluctuations, and dose requirements for higher throughput, appropriate parameters of the patterning process may be determined.

The optimization process therefore is to find a set of values of the design variables, under the constraints $(z_1, z_2, \ldots, z_N) \in Z$, that minimize the cost function, i.e., to find $$(z_1, z_2, \ldots, z_N) = \underset{(z_1, z_2, \ldots z_N) \in Z}{\arg\min} CF(z_1, z_2, \ldots, z_N) =$$
$$\underset{(z_1, z_2, \ldots, z_N) \in Z}{\arg\min} \sum_{p=1}^{P} w_p f_p^2(z_1, z_2, \ldots, z_N)$$

(Eq. 2)

Figure 11:
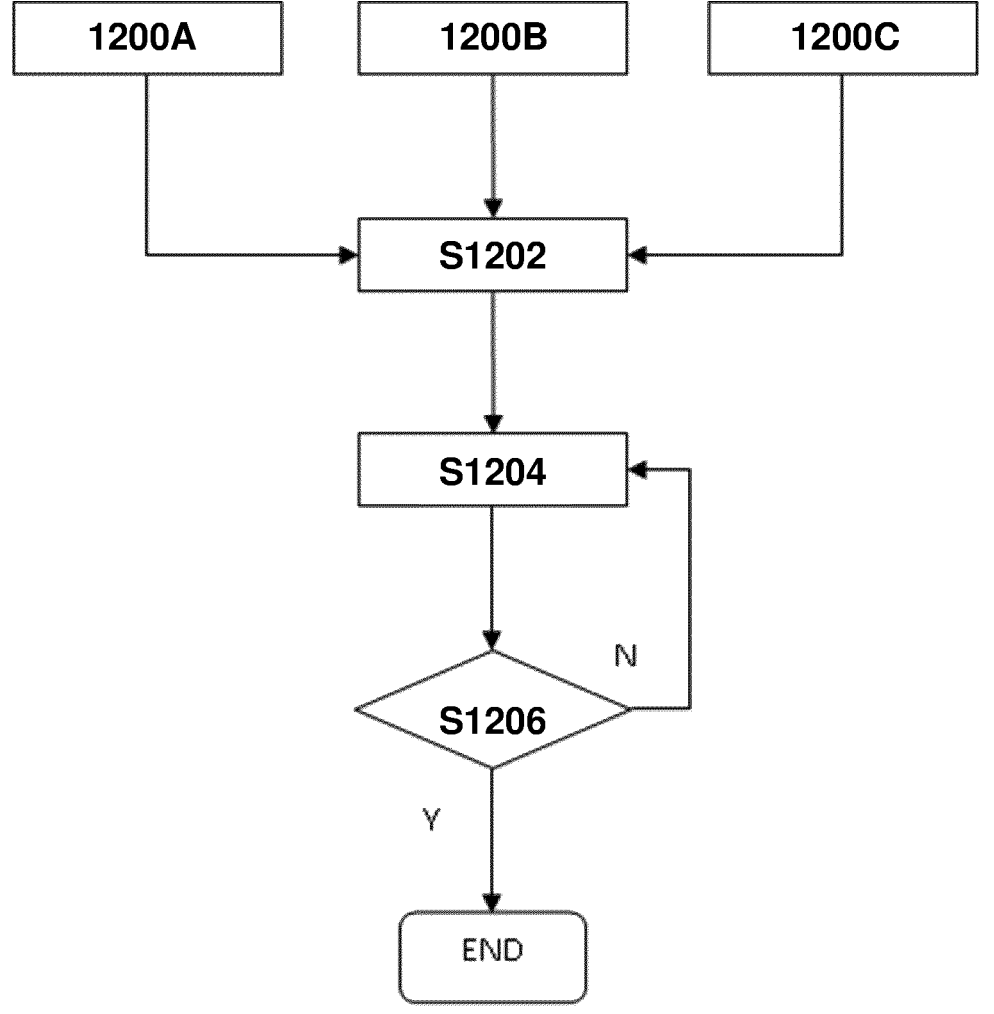
FIG. 11 is a flow diagram illustrating aspects of an example methodology of joint optimization, according to an embodiment.

A general method of optimizing the lithography projection apparatus, according to an embodiment, is illustrated in FIG. 11. This method comprises a step S1202 of defining a multi-variable cost function of a plurality of design variables. The design variables may comprise any suitable combination selected from characteristics of the illumination source (1200A) (e.g., pupil fill ratio, namely percentage of radiation of the source that passes through a pupil or aperture), characteristics of the projection optics (1200B) and characteristics of the design layout (1200C). For example, the design variables may include characteristics of the illumination source (1200A) and characteristics of the design layout (1200C) (e.g., global bias) but not characteristics of the projection optics (1200B), which leads to an SMO. Alternatively, the design variables may include characteristics of the illumination source (1200A), characteristics of the projection optics (1200B) and characteristics of the design layout (1200C), which leads to a source-mask-lens optimization (SMLO). In step S1204, the design variables are simultaneously adjusted so that the cost function is moved towards convergence. In step S1206, it is determined whether a predefined termination condition is satisfied. The predetermined termination condition may include various possibilities, i.e. the cost function may be minimized or maximized, as required by the numerical technique used, the value of the cost function has been equal to a threshold value or has crossed the threshold value, the value of the cost function has reached within a preset error limit, or a preset number of iteration is reached. If either of the conditions in step S1206 is satisfied, the method ends. If none of the conditions in step S1206 is satisfied, the step S1204 and S1206 are iteratively repeated until a desired result is obtained. The optimization does not necessarily lead to a single set of values for the design variables because there may be physical restraints caused by factors such as the failure rates, the pupil fill factor, the resist chemistry, the throughput, etc. The optimization may provide multiple sets of values for the design variables and associated performance characteristics (e.g., the throughput) and allows a user of the lithographic apparatus to pick one or more sets.

In a lithographic projection apparatus, the source, patterning device and projection optics can be optimized alternatively (referred to as Alternative Optimization) or optimized simultaneously (referred to as Simultaneous Optimization). The terms "simultaneous", "simultaneously", "joint" and "jointly" as used herein mean that the design variables of the characteristics of the source, patterning device, projection optics and/or any other design variables, are allowed to change at the same time. The term "alternative" and "alternatively" as used herein mean that not all of the design variables are allowed to change at the same time.

Figure 12:
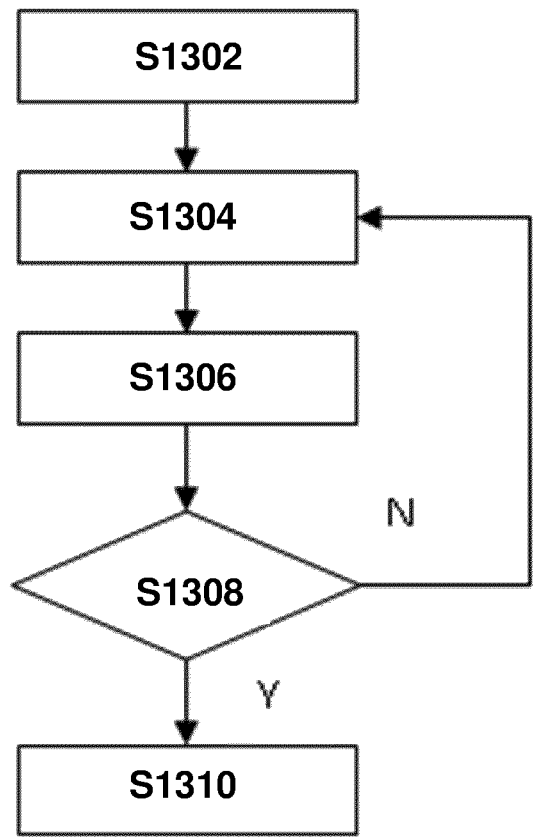
FIG. 12 shows an embodiment of another optimization method, according to an embodiment.

In FIG. 12, the optimization of all the design variables is executed simultaneously. Such flow may be called the simultaneous flow or co-optimization flow. Alternatively, the optimization of all the design variables is executed alternatively, as illustrated in FIG. 12. In this flow, in each step, some design variables are fixed while the other design variables are optimized to minimize the cost function; then in the next step, a different set of variables are fixed while the others are optimized to minimize the cost function. These steps are executed alternatively until convergence or certain terminating conditions are met.

As shown in the non-limiting example flowchart of FIG. 12, first, a design layout (step S1302) is obtained, then a step of source optimization is executed in step S1304, where all the design variables of the illumination source are optimized (SO) to minimize the cost function while all the other design variables are fixed. Then in the next step S1306, a mask optimization (MO) is performed, where all the design variables of the patterning device are optimized to minimize the cost function while all the other design variables are fixed. These two steps are executed alternatively, until certain terminating conditions are met in step S1308. Various termination conditions can be used, such as, the value of the cost function becomes equal to a threshold value, the value of the cost function crosses the threshold value, the value of the cost function reaches within a preset error limit, or a preset number of iteration is reached, etc. Note that SO-MO-Alternative-Optimization is used as an example for the alternative flow. The alternative flow can take many different forms, such as SO-LO-MO-Alternative-Optimization, where SO, LO (Lens Optimization) is executed, and MO alternatively and iteratively; or first SMO can be executed once, then execute LO and MO alternatively and iteratively; and so on. Finally, the output of the optimization result is obtained in step S1310, and the process stops.

The pattern selection algorithm, as discussed before, may be integrated with the simultaneous or alternative optimization. For example, when an alternative optimization is adopted, first a full-chip SO can be performed, the 'hot spots' and/or 'warm spots' are identified, then an MO is performed. In view of the present disclosure numerous permutations and combinations of sub-optimizations are possible in order to achieve the desired optimization results.

Figure 13A:
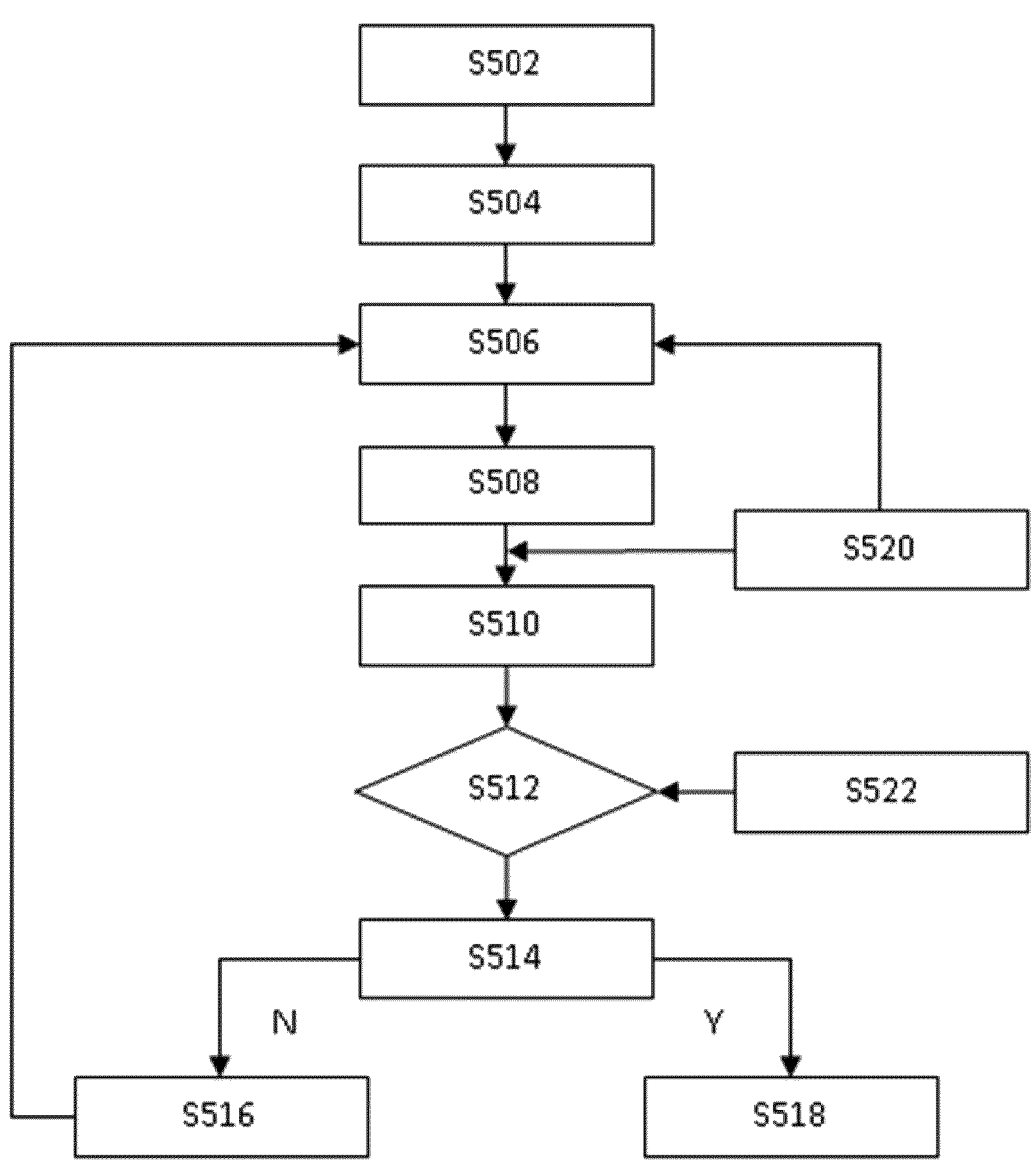
FIGS. 13A, 13B and 14 show example flowcharts of various optimization processes, according to an embodiment.

FIG. 13A shows one exemplary method of optimization, where a cost function is minimized. In step S502, initial values of design variables are obtained, including their tuning ranges, if any. In step S504, the multi-variable cost function is set up. In step S506, the cost function is expanded within a small enough neighborhood around the starting point value of the design variables for the first iterative step (i=0). In step S508, standard multi-variable optimization techniques are applied to minimize the cost function. Note that the optimization problem can apply constraints, such as tuning ranges, during the optimization process in S508 or at a later stage in the optimization process. Step S520 indicates that each iteration is done for the given test patterns (also known as "gauges") for the identified evaluation points that have been selected to optimize the lithographic process. In step S510, a lithographic response is predicted. In step S512, the result of step S510 is compared with a desired or ideal lithographic response value obtained in step S522. If the termination condition is satisfied in step S514, i.e. the optimization generates a lithographic response value sufficiently close to the desired value, and then the final value of the design variables is outputted in step S518. The output step may also include outputting other functions using the final values of the design variables, such as outputting a wavefront aberration-adjusted map at the pupil plane (or other planes), an optimized source map, and optimized design layout etc. If the termination condition is not satisfied, then in step S516, the values of the design variables is updated with the result of the i-th iteration, and the process goes back to step S506. The process of FIG. 13A is elaborated in details below.

In an exemplary optimization process, no relationship between the design variables ($z_1$, $z_2$, . . . , $z_N$) and $f_p(z_1, z_2, . . . , z_N)$ is assumed or approximated, except that $f_p(z_1, z_2, . . . , z_N)$ is sufficiently smooth (e.g. first order derivatives $$\frac{\partial f_p(z_1, z_2, \ldots, z_N)}{\partial z_n},$$

(n=1, 2, . . . N) exist), which is generally valid in a lithographic projection apparatus. An algorithm, such as the Gauss-Newton algorithm, the Levenberg-Marquardt algorithm, the gradient descent algorithm, simulated annealing, the genetic algorithm, can be applied to find ($\tilde{z}_1$, $\tilde{z}_2$, . . . $\tilde{z}_N$).

Here, the Gauss-Newton algorithm is used as an example. The Gauss-Newton algorithm is an iterative method applicable to a general non-linear multi-variable optimization problem. In the i-th iteration wherein the design variables ($z_1$, $z_2$, . . . , $z_N$) take values of ($z_{1i}$, $z_{2i}$, . . . , $z_{Ni}$), the Gauss-Newton algorithm linearizes $f_p(z_1, z_2, . . . , z_N)$ in the vicinity of ($z_{1i}$, $z_{2i}$, . . . , $z_{Ni}$), and then calculates values ($z_{1(i+1)}$, $z_{2(i+1)}$, . . . , $z_{N(i+1)}$) in the vicinity of ($z_{1i}$, $z_{2i}$, . . . , $z_{Ni}$) that give a minimum of CF($z_1$, $z_2$, . . . , $z_N$). The design variables ($z_1$, $z_2$, . . . , $z_N$) take the values of ($z_{1(i+1)}$, $z_{2(i+1)}$, . . . , $z_{N(i+1)}$) in the (i+1)-th iteration. This iteration continues until convergence (i.e. CF($z_1$, $z_2$, . . . , $z_N$) does not reduce any further) or a preset number of iterations is reached.

Specifically, in the i-th iteration, in the vicinity of ($z_{1i}$, $z_{2i}$, . . . , $z_{Ni}$), $$f_p(z_1, z_2, \ldots, z_N) \approx f_p(z_{1i}, z_{2i}, \ldots, z_{Ni}) + \tag{Eq. 3}$$
$$\sum_{n=1}^{N} \frac{\partial f_p(z_1, z_2, \ldots, z_N)}{\partial z_n}\bigg|_{z_1=z_{1i}, z_2=z_{2i}, \ldots, z_N=z_{Ni.}} (z_n - z_{ni})$$

Under the approximation of Eq. 3, the cost function becomes:

$$CF(z_1, z_2, \ldots, z_N) = \tag{Eq. 4}$$
$$\sum_{p=1}^{P} w_p f_p^2(z_1, z_2, \ldots, z_N) = \sum_{p=1}^{P} w_p \left( f_p(z_{1i}, z_{2i}, \ldots, z_{Ni}) + \right.$$
$$\left. \sum_{n=1}^{N} \frac{\partial f_p(z_1, z_2, \ldots, z_N)}{\partial z_n}\bigg|_{z_1=z_{1i}, z_2=z_{2i}, \ldots, z_N=z_{Ni.}} (z_n - z_{ni}) \right)^2$$

which is a quadratic function of the design variables ($z_1$, $z_2$, . . . , $z_N$). Every term is constant except the design variables ($z_1$, $z_2$, . . . , $z_N$).

If the design variables ($z_1$, $z_2$, . . . , $z_N$) are not under any constraints, ($z_{1(i+1)}$, $z_{2(i+1)}$, . . . , $z_{N(i+1)}$) can be derived by solving by N linear equations:

$$\frac{\partial CF(z_1, z_2, \ldots, z_N)}{\partial z_n} = 0, \text{ wherein } n = 1, 2, \ldots, N.$$

If the design variables $(z_1, z_2, \ldots, z_N)$ are under the constraints in the form of J inequalities (e.g. tuning ranges of $(z_1, z_2, \ldots, z_N)$)

$$\sum_{n=1}^{N} A_{nj} z_n \le B_j,$$

for $j=1, 2, \ldots J$; and K equalities (e.g. interdependence between the design variables)

$$\sum_{n=1}^{N} C_{nk} z_n = D_k,$$

for $k=1, 2, \ldots K$; the optimization process becomes a classic quadratic programming problem, wherein $A_{nj}$, $B_j$, $C_{nk}$, $D_k$ are constants. Additional constraints can be imposed for each iteration. For example, a "damping factor" $\Delta_D$ can be introduced to limit the difference between $(z_{1(i+1)}, z_{2(i+1)}, \ldots, z_{N(i+1)})$ and $(z_{1i}, z_{2i}, \ldots, z_{Ni})$, so that the approximation of Eq. 3 holds. Such constraints can be expressed as $z_{ni} - \Delta_D \le z_n \le z_{ni} + \Delta_D$. $(z_{1(i+1)}, z_{2(i+1)}, \ldots, z_{N(i+1)})$ can be derived using, for example, methods described in Numerical Optimization ($2^{nd}$ ed.) by Jorge Nocedal and Stephen J. Wright (Berlin New York: Vandenberghe. Cambridge University Press).

Instead of minimizing the RMS of $f_p(z_1, z_2, \ldots, z_N)$, the optimization process can minimize magnitude of the largest deviation (the worst defect) among the evaluation points to their intended values. In this approach, the cost function can alternatively be expressed as $$CF(z_1, z_2, \ldots, z_N) = \max_{1 \le p \le P} \frac{f_p(z_1, z_2, \ldots, z_N)}{CL_p}, \qquad \text{(Eq. 5)}$$

wherein $CL_p$ is the maximum allowed value for $f_p(z_1, z_2, \ldots, z_N)$. This cost function represents the worst defect among the evaluation points. Optimization using this cost function minimizes magnitude of the worst defect. An iterative greedy algorithm can be used for this optimization.

The cost function of Eq. 5 can be approximated as:

$$CF(z_1, z_2, \ldots, z_N) = \sum_{p=1}^{P} \left( \frac{f_p(z_1, z_2, \ldots, z_N)}{CL_p} \right)^q, \qquad \text{(Eq. 6)}$$

wherein q is an even positive integer such as at least 4, preferably at least 10. Eq 6 mimics the behavior of Eq. 5, while allowing the optimization to be executed analytically and accelerated by using methods such as the deepest descent method, the conjugate gradient method, etc.

Minimizing the worst defect size can also be combined with linearizing of $f_p(z_1, z_2, \ldots, z_N)$. Specifically, $f_p(z_1, z_2, \ldots, z_N)$ is approximated as in Eq. 3. Then the constraints on worst defect size are written as inequalities $E_{Lp} \le f_p(z_1, z_2, \ldots, z_N) \le E_{Up}$, wherein $E_{Lp}$ and $E_{Up}$ are two constants specifying the minimum and maximum allowed deviation for the $f_p(z_1, z_2, \ldots, z_N)$. Plugging Eq. 3 in, these constraints are transformed to, for $p=1, \ldots P$, $$\sum_{n=1}^{N} \frac{\partial f_p(z_1, z_2, \ldots, z_N)}{\partial z_n} \Bigg|_{z_1 = z_{1i}, z_2 = z_{2i}, \ldots, z_N = z_{Ni.}} z_n \le \qquad \text{(Eq. 6')}$$

$$E_{Up} \sum_{n=1}^{N} \frac{\partial f_p(z_1, z_2, \ldots, z_N)}{\partial z_n} \Bigg|_{z_1 = z_{1i}, z_2 = z_{2i}, \ldots, z_N = z_{Ni.}} z_{ni} - $$

$$f_p(z_{1i}, z_{2i}, \ldots, z_{Ni})$$

and $$-\sum_{n=1}^{N} \frac{\partial f_p(z_1, z_2, \ldots, z_N)}{\partial z_n} \Bigg|_{z_1 = z_{1i}, z_2 = z_{2i}, \ldots, z_N = z_{Ni.}} z_n \le \qquad \text{(Eq. 6'')}$$

$$-E_{Up} - \sum_{n=1}^{N} \frac{\partial f_p(z_1, z_2, \ldots, z_N)}{\partial z_n} \Bigg|_{z_1 = z_{1i}, z_2 = z_{2i}, \ldots, z_N = z_{Ni.}} z_{ni} + $$

$$f_p(z_{1i}, z_{2i}, \ldots, z_{Ni})$$

Since Eq. 3 is generally valid only in the vicinity of $(z_{1i}, z_{2i}, \ldots, z_{Ni})$, in case the desired constraints $E_{Lp} \le f_p(z_1, z_2, \ldots, z_N) \le E_{Up}$ cannot be achieved in such vicinity, which can be determined by any conflict among the inequalities, the constants $E_{Lp}$ and $E_{Up}$ can be relaxed until the constraints are achievable. This optimization process minimizes the worst defect size in the vicinity of $(z_{1i}, z_{2i}, \ldots, z_{Ni})$. Then each step reduces the worst defect size gradually, and each step is executed iteratively until certain terminating conditions are met. This will lead to optimal reduction of the worst defect size.

Another way to minimize the worst defect is to adjust the weight $w_p$ in each iteration. For example, after the i-th iteration, if the r-th evaluation point is the worst defect, $w_r$ can be increased in the (i+1)-th iteration so that the reduction of that evaluation point's defect size is given higher priority.

In addition, the cost functions in Eq.4 and Eq.5 can be modified by introducing a Lagrange multiplier to achieve compromise between the optimization on RMS of the defect size and the optimization on the worst defect size, i.e., $$CF(z_1, z_2, \ldots, z_N) = \qquad \text{(Eq. 6''')}$$

$$(1 - \lambda) \sum_{p=1}^{P} w_p f_p^2(z_1, z_2, \ldots, z_N) + \lambda \max_{1 \le p \le P} \frac{f_p(z_1, z_2, \ldots, z_N)}{CL_p}$$

where $\lambda$ is a preset constant that specifies the trade-off between the optimization on RMS of the defect size and the optimization on the worst defect size. In particular, if $\lambda = 0$, then this becomes Eq.4 and the RMS of the defect size is only minimized; while if $\lambda = 1$, then this becomes Eq.5 and the worst defect size is only minimized; if $0 < \lambda < 1$, then both are taken into consideration in the optimization. Such optimization can be solved using multiple methods. For example, the weighting in each iteration may be adjusted, similar to the one described previously. Alternatively, similar to minimizing the worst defect size from inequalities, the inequalities of Eq. 6' and 6'' can be viewed as constraints of the design variables during solution of the quadratic programming problem. Then, the bounds on the worst defect size can be relaxed incrementally or increase the weight for the worst defect size incrementally, compute the cost function value for every achievable worst defect size, and choose the design variable values that minimize the total cost function as the initial point for the next step. By doing this iteratively, the minimization of this new cost function can be achieved.

Optimizing a lithographic projection apparatus can expand the process window. A larger process window provides more flexibility in process design and chip design. The process window can be defined as a set of focus and dose values for which the resist image are within a certain limit of the design target of the resist image. Note that all the methods discussed here may also be extended to a generalized process window definition that can be established by different or additional base parameters in addition to exposure dose and defocus. These may include, but are not limited to, optical settings such as NA, sigma, aberrations, polarization, or optical constants of the resist layer. For example, as described earlier, if the PW also consists of different mask bias, then the optimization includes the minimization of MEEF (Mask Error Enhancement Factor), which is defined as the ratio between the substrate EPE and the induced mask edge bias. The process window defined on focus and dose values only serve as an example in this disclosure. A method of maximizing the process window, according to an embodiment, is described below.

In a first step, starting from a known condition $(f_0, \varepsilon_0)$ in the process window, wherein $f_0$ is a nominal focus and $\varepsilon_0$ is a nominal dose, minimizing one of the cost functions below in the vicinity $(f_0 \pm \Delta f, \varepsilon_0 \pm \Delta \varepsilon)$:

$$CF(z_1, z_2, \ldots, z_N, f_0, \varepsilon_0) = \quad \text{(Eq. 7)}$$

$$\max_{(f,\varepsilon)=(f_0 \pm \Delta_f, \varepsilon_0 \pm \Delta \varepsilon)} \max_p |f_p(z_1, z_2, \ldots, z_N, f, \varepsilon)|.$$

or $$CF(z_1, z_2, \ldots, z_N, f_0, \varepsilon_0) = \quad \text{(Eq. 7')}$$

$$\sum_{(f,\varepsilon)=(f_0 \pm \Delta_f, \varepsilon_0 \pm \Delta \varepsilon)} \sum_p w_p f_p^2(z_1, z_2, \ldots, z_N, f, \varepsilon)$$

or $$CF(z_1, z_2, \ldots, z_N, f_0, \varepsilon_0) = \quad \text{(Eq. 7'')}$$

$$(1-\lambda) \sum_{(f,\varepsilon)=(f_0 \pm \Delta_f, \varepsilon_0 \pm \Delta \varepsilon)} \sum_p w_p f_p^2(z_1, z_2, \ldots, z_N, f, \varepsilon) +$$

$$\lambda \max_{(f,\varepsilon)=(f_0 \pm \Delta_f, \varepsilon_0 \pm \Delta \varepsilon)} \max_p |f_p(z_1, z_2, \ldots, z_N, f, \varepsilon)|$$

If the nominal focus $f_0$ and nominal dose $\varepsilon_0$ are allowed to shift, they can be optimized jointly with the design variables $(z_1, z_2, \ldots, z_N)$. In the next step, $(f_0 \pm \Delta f, \varepsilon_0 \pm \Delta \varepsilon)$ is accepted as part of the process window, if a set of values of $(z_1, z_2, \ldots, z_N, f, \varepsilon)$ can be found such that the cost function is within a preset limit.

Alternatively, if the focus and dose are not allowed to shift, the design variables $(z_1, z_2, \ldots, z_N)$ are optimized with the focus and dose fixed at the nominal focus $f_0$ and nominal dose $\varepsilon_0$. In an alternative embodiment, $(f_0 \pm \Delta f, \varepsilon_0 \pm \Delta \varepsilon)$ is accepted as part of the process window, if a set of values of $(z_1, z_2, \ldots, z_N)$ can be found such that the cost function is within a preset limit.

The methods described earlier in this disclosure can be used to minimize the respective cost functions of Eqs. 7, 7', or 7''. If the design variables are characteristics of the projection optics, such as the Zernike coefficients, then minimizing the cost functions of Eqs. 7, 7', or 7'' leads to process window maximization based on projection optics optimization, i.e., LO. If the design variables are characteristics of the source and patterning device in addition to those of the projection optics, then minimizing the cost function of Eqs. 7, 7', or 7'' leads to process window maximizing based on SMLO, as illustrated in FIG. 12. If the design variables are characteristics of the source and patterning device and, then minimizing the cost functions of Eqs. 7, 7', or 7'' leads to process window maximization based on SMO. The cost functions of Eqs. 7, 7', or 7'' can also include at least one $f_p(z_1, z_2, \ldots, z_N)$ such as that in Eq. 7 or Eq. 8, that is a function of one or more stochastic effects such as the LWR or local CD variation of 2D features, and throughput.

Figure 14:
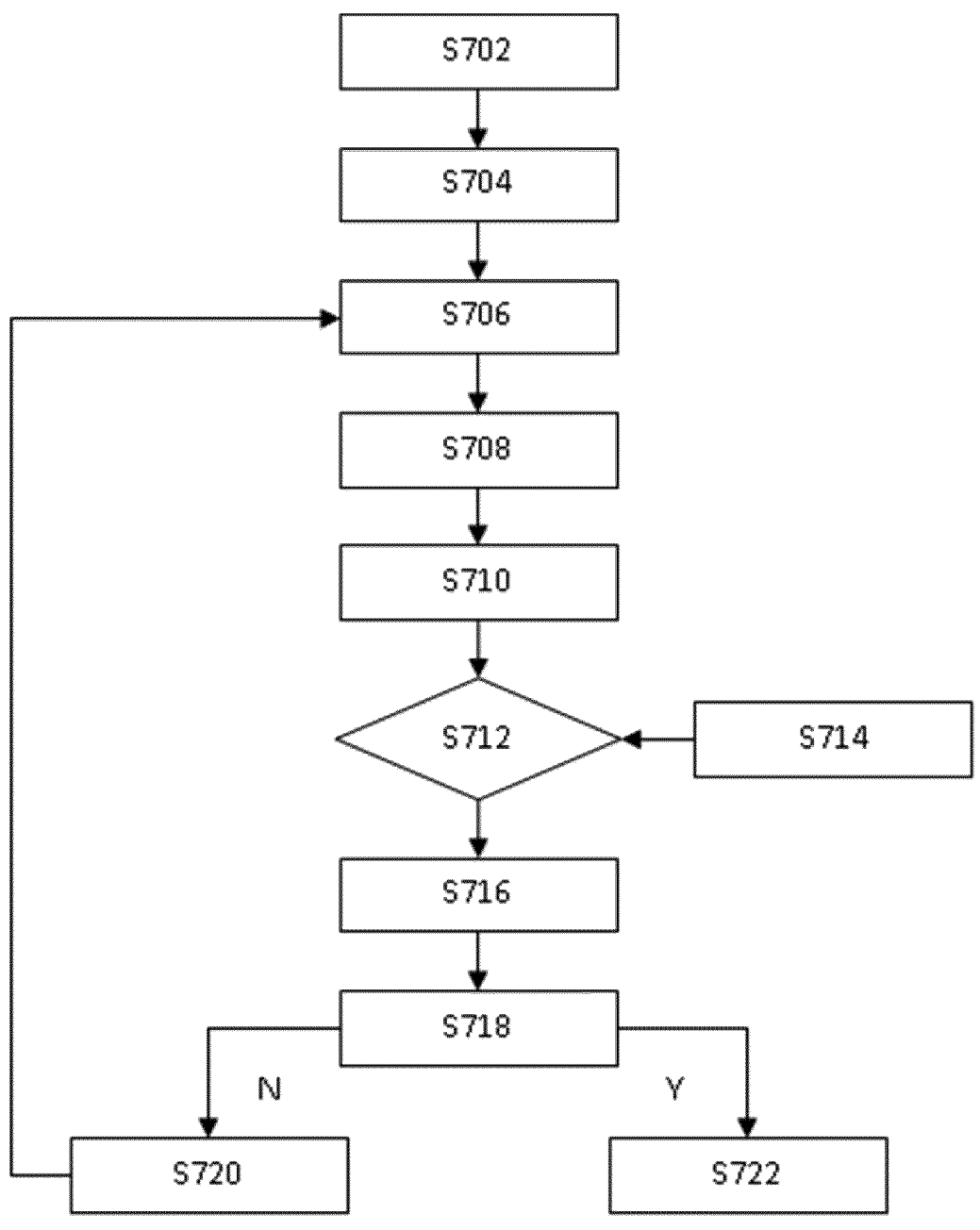

FIG. 14 shows one specific example of how a simultaneous SMLO process can use a Gauss Newton Algorithm for optimization. In step S702, starting values of design variables are identified. Tuning ranges for each variable may also be identified. In step S704, the cost function is defined using the design variables. In step S706 cost function is expanded around the starting values for all evaluation points in the design layout. In optional step S710, a full-chip simulation is executed to cover all critical patterns in a full-chip design layout. Desired lithographic response metric (such as CD or EPE) is obtained in step S714, and compared with predicted values of those quantities in step S712. In step S716, a process window is determined. Steps S718, S720, and S722 are similar to corresponding steps S514, S516 and S518, as described with respect to FIG. 13A. As mentioned before, the final output may be a wavefront aberration map in the pupil plane, optimized to produce the desired imaging performance. The final output may also be an optimized source map and/or an optimized design layout.

Figure 13B:
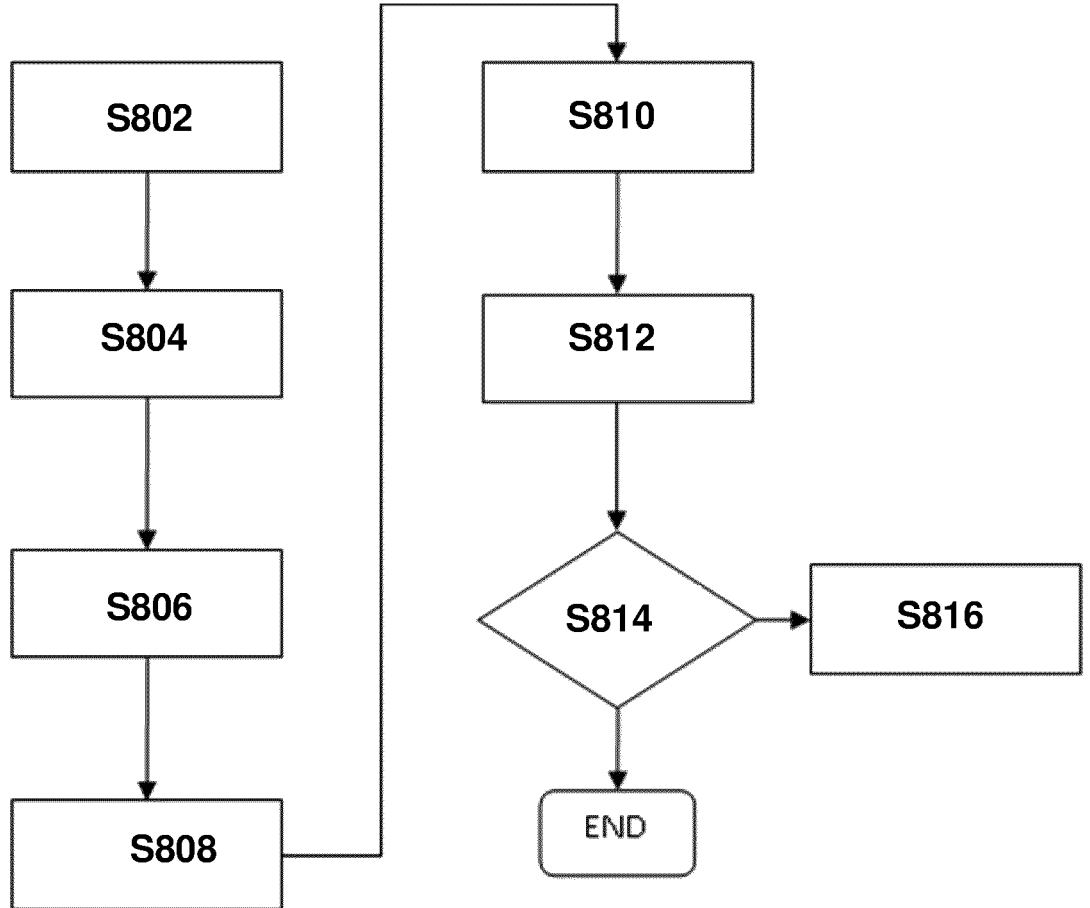

FIG. 13B shows an exemplary method to optimize the cost function where the design variables $(z_1, z_2, \ldots, z_N)$ include design variables that may only assume discrete values.

The method starts by defining the pixel groups of the illumination source and the patterning device tiles of the patterning device (step S802). Generally, a pixel group or a patterning device tile may also be referred to as a division of a lithographic process component. In one exemplary approach, the illumination source is divided into "117" pixel groups, and "94" patterning device tiles are defined for the patterning device, substantially as described above, resulting in a total of "211" divisions.

In step S804, a lithographic model is selected as the basis for photolithographic simulation. Photolithographic simulations produce results that are used in calculations of photolithographic metrics, or responses. A particular photolithographic metric is defined to be the performance metric that is to be optimized (step S806). In step S808, the initial (pre-optimization) conditions for the illumination source and the patterning device are set up. Initial conditions include initial states for the pixel groups of the illumination source and the patterning device tiles of the patterning device such that references may be made to an initial illumination shape and an initial patterning device pattern. Initial conditions may also include mask bias, NA, and focus ramp range. Although steps S802, S804, S806, and S808 are depicted as sequential steps, it will be appreciated that in other embodiments of the invention, these steps may be performed in other sequences.

In step S810, the pixel groups and patterning device tiles are ranked. Pixel groups and patterning device tiles may be interleaved in the ranking Various ways of ranking may be employed, including: sequentially (e.g., from pixel group 1 to pixel group 117 and from patterning device tile "1" to patterning device tile "94"), randomly, according to the physical locations of the pixel groups and patterning device tiles (e.g., ranking pixel groups closer to the center of the illumination source higher), and according to how an alteration of the pixel group or patterning device tile affects the performance metric.

Once the pixel groups and patterning device tiles are ranked, the illumination source and patterning device are adjusted to improve the performance metric (step S812). In step S812, each of the pixel groups and patterning device tiles are analyzed, in order of ranking, to determine whether an alteration of the pixel group or patterning device tile will result in an improved performance metric. If it is determined that the performance metric will be improved, then the pixel group or patterning device tile is accordingly altered, and the resulting improved performance metric and modified illumination shape or modified patterning device pattern form the baseline for comparison for subsequent analyses of lower-ranked pixel groups and patterning device tiles. In other words, alterations that improve the performance metric are retained. As alterations to the states of pixel groups and patterning device tiles are made and retained, the initial illumination shape and initial patterning device pattern changes accordingly, so that a modified illumination shape and a modified patterning device pattern result from the optimization process in step S812.

In other approaches, patterning device polygon shape adjustments and pairwise polling of pixel groups and/or patterning device tiles are also performed within the optimization process of S812.

In an alternative embodiment the interleaved simultaneous optimization procedure may include to alter a pixel group of the illumination source and if an improvement of the performance metric is found, the dose is stepped up and down to look for further improvement. In a further alternative embodiment the stepping up and down of the dose or intensity may be replaced by a bias change of the patterning device pattern to look for further improvement in the simultaneous optimization procedure.

In step S814, a determination is made as to whether the performance metric has converged. The performance metric may be considered to have converged, for example, if little or no improvement to the performance metric has been witnessed in the last several iterations of steps S810 and S812. If the performance metric has not converged, then the steps of S810 and S812 are repeated in the next iteration, where the modified illumination shape and modified patterning device from the current iteration are used as the initial illumination shape and initial patterning device for the next iteration (step S816).

The optimization methods described above may be used to increase the throughput of the lithographic projection apparatus. For example, the cost function may include an $f_p(z_1, z_2, \ldots, z_N)$ that is a function of the exposure time. Optimization of such a cost function is preferably constrained or influenced by a measure of the stochastic effects or other metrics. Specifically, a computer-implemented method for increasing a throughput of a lithographic process may include optimizing a cost function that is a function of one or more stochastic effects of the lithographic process and a function of an exposure time of the substrate, in order to minimize the exposure time.

In one embodiment, the cost function includes at least one $f_p(z_1, z_2, \ldots, z_N)$ that is a function of one or more stochastic effects. The stochastic effects may include the failure of a feature, measurement data (e.g., SEPE) determined as in method of FIG. 3, LWR or local CD variation of 2D features. In one embodiment, the stochastic effects include stochastic variations of characteristics of a resist image. For example, such stochastic variations may include failure rate of a feature, line edge roughness (LER), line width roughness (LWR) and critical dimension uniformity (CDU). Including stochastic variations in the cost function allows finding values of design variables that minimize the stochastic variations, thereby reducing risk of defects due to stochastic effects.

Figure 15:
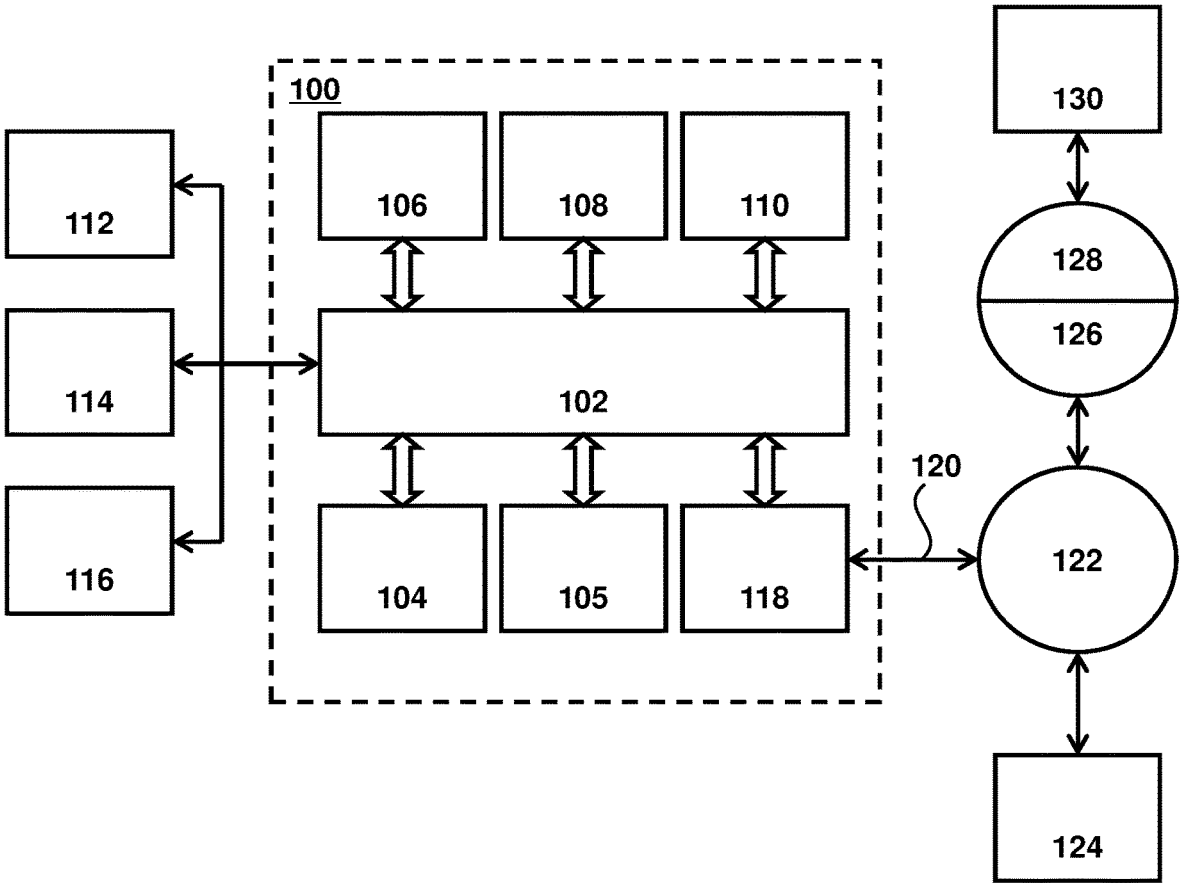
FIG. 15 is a block diagram of an example computer system, according to an embodiment.

FIG. 15 is a block diagram that illustrates a computer system 100 that can assist in implementing the methods, flows, or the apparatus disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of one or more methods described herein may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer (e.g., a server and/or other computing devices), a solid-state storage device, and/or in other locations. The remote computer can load the instructions into its dynamic memory and send the instructions over a wireless communication network (e.g., the internet, a cellular communications network, etc.), through a telephone line using a modem, and/or by other methods. A modem and/or other data receiving components local to computer system 100 can receive the data via the wireless communication network, on the telephone line, etc., and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide all or part of a method described herein, for example. The received code may be executed by processor 104 as it is received, and/or stored in storage device 110, or other non-volatile storage for later execution. In this manner, computer system 100 may obtain application code in the form of a carrier wave.

Figure 16:
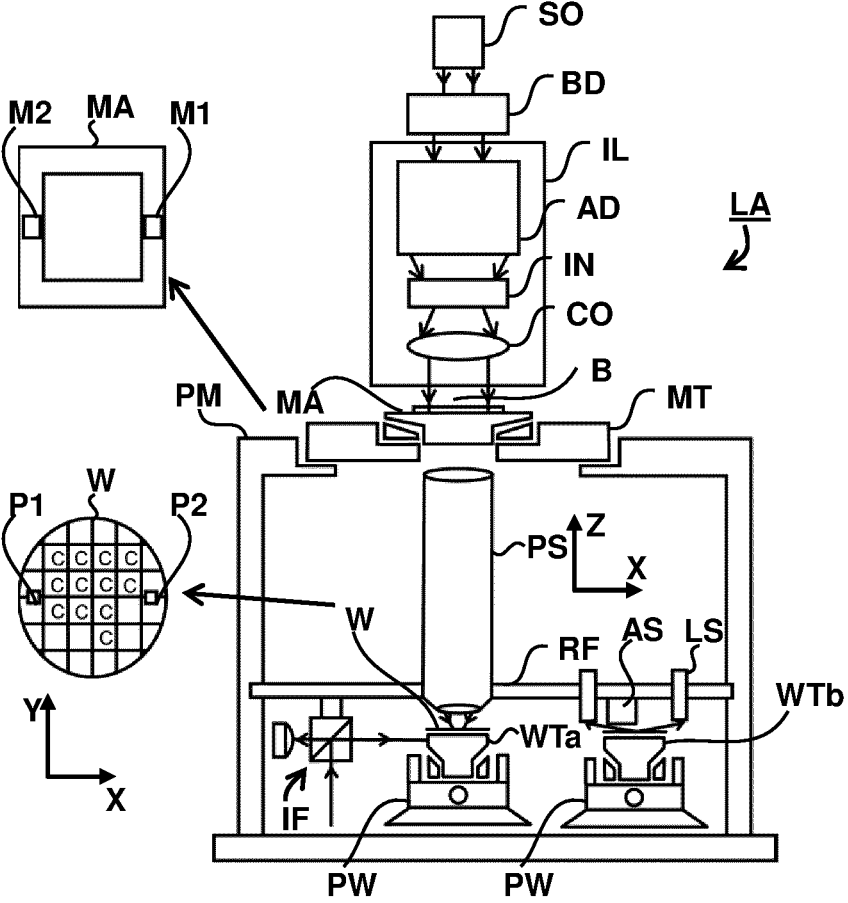
FIG. 16 is a schematic diagram of a lithographic projection apparatus, according to an embodiment.

FIG. 16 schematically depicts an exemplary lithographic projection apparatus whose illumination source could be optimized utilizing the methods described herein. The apparatus comprises:

an illumination system IL, to condition a beam B of radiation. In this particular case, the illumination system also comprises a radiation source SO;

a first object table (e.g., mask table) MT provided with a patterning device holder to hold a patterning device MA (e.g., a reticle), and connected to a first positioner to accurately position the patterning device with respect to item PS;

a second object table (substrate table) WT provided with a substrate holder to hold a substrate W (e.g., a resist-coated silicon wafer), and connected to a second positioner to accurately position the substrate with respect to item PS;

a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning device as an alternative to the use of a classic mask; examples include a programmable mirror array or LCD matrix.

The source SO (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

It should be noted with regard to FIG. 16 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or $F_2$ lasing).

The beam PB subsequently intercepts the patterning device MA, which is held on a patterning device table MT. Having traversed the patterning device MA, the beam B passes through the lens PL, which focuses the beam B onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 16. However, in the case of a wafer stepper (as opposed to a step-and-scan tool) the patterning device table MT may just be connected to a short stroke actuator, or may be fixed.

The depicted tool can be used in two different modes:

In step mode, the patterning device table MT is kept essentially stationary, and an entire patterning device image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed $V=Mv$, in which M is the magnification of the lens PL (typically, $M=\frac{1}{4}$ or $\frac{1}{5}$). In this manner, a relatively large target portion C can be exposed, without having to compromise on resolution.

Figure 17:
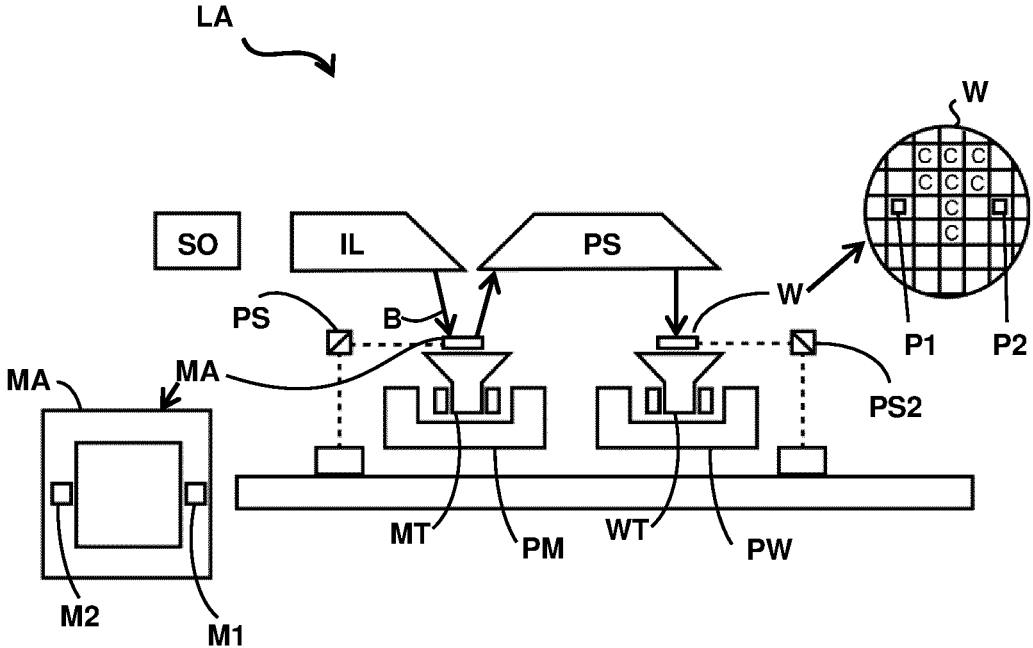
FIG. 17 is a schematic diagram of another lithographic projection apparatus, according to an embodiment.

FIG. 17 schematically depicts another exemplary lithographic projection apparatus LA whose illumination source could be optimized utilizing the methods described herein. The lithographic projection apparatus LA includes:

a source collector module SO an illumination system (illuminator) IL configured to condition a radiation beam B (e.g. EUV radiation).

a support structure (e.g. a mask table) MT constructed to support a patterning device (e.g. a mask or a reticle) MA and connected to a first positioner PM configured to accurately position the patterning device;

a substrate table (e.g. a wafer table) WT constructed to hold a substrate (e.g. a resist coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

As here depicted, the apparatus LA is of a reflective type (e.g. employing a reflective mask). It is to be noted that because most materials are absorptive within the EUV wavelength range, the mask may have multilayer reflectors comprising, for example, a multi-stack of Molybdenum and Silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 17, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 17, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus LA could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 18:
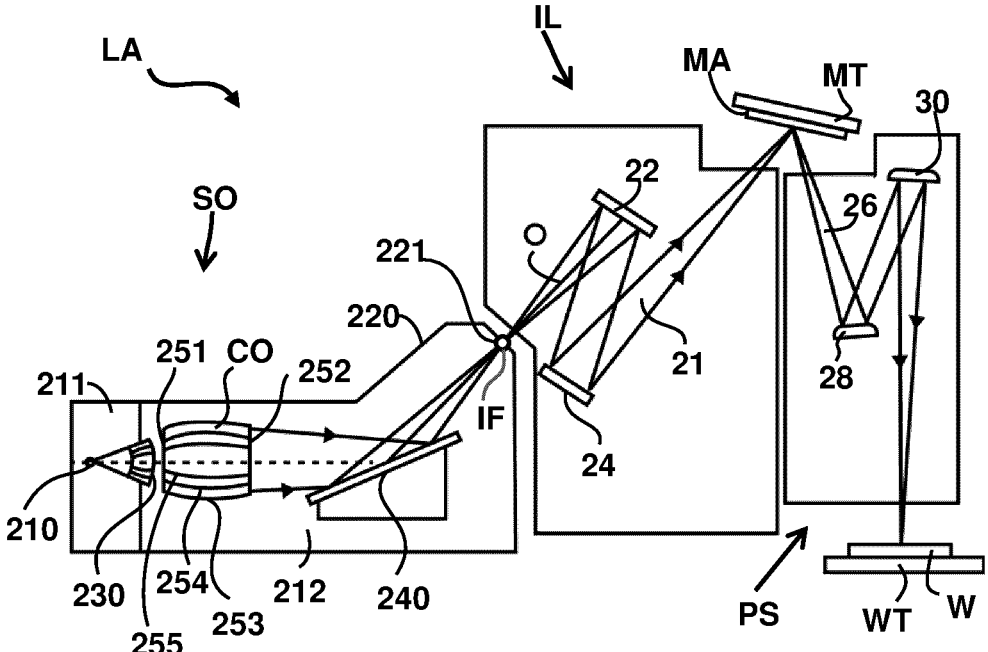
FIG. 18 is a more detailed view of the apparatus in FIG. 17, according to an embodiment.

FIG. 18 shows the apparatus LA in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 18.

Collector optic CO, as illustrated in FIG. 18, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type is preferably used in combination with a discharge produced plasma source, often called a DPP source.

Figure 19:
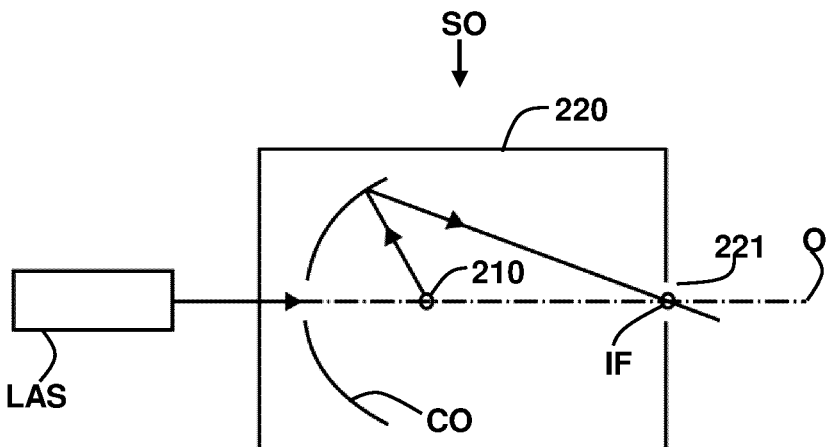
FIG. 19 is a more detailed view of the source collector module SO of the apparatus of FIGS. 17 and 18, according to an embodiment.

Alternatively, the source collector module SO may be part of an LPP radiation system as shown in FIG. 19. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The invention may further be described using the following clauses:

1. A non-transitory computer-readable medium for imaging portions of design layouts onto a substrate using a lithographic projection apparatus having an illumination source and projection optics having instructions that, when executed by a computer, cause operations comprising:

receiving a physical dose, wherein the physical dose is indicative of a dose received from the illumination source at the substrate through an open-frame mask;

inputting the physical does and a plurality of design variables that are representative of characteristics of a patterning process into a lithographic model, wherein the design variables includes (a) a pupil shape of an illumination source of a lithographic projection apparatus, and (b) a design layout to be printed on a substrate using the lithographic projection apparatus, wherein the lithographic model is configured to:

compute, using the physical dose, a multi-variable cost function of the plurality of design variables, wherein the multi-variable cost function is a function of a throughput of the patterning process, and adjust the design variables until a predefined termination condition is satisfied;

receiving an output from the lithographic model based on the physical dose, the output including an image of an adjusted design layout and an image of an adjusted pupil shape of the illumination source; and generating for display, on a user interface, the output.

2. A non-transitory computer-readable medium having instructions that, when executed by a computer, cause the computer to execute a method to improve a patterning process for imaging a portion of a design layout onto a substrate using a lithographic projection apparatus having an illumination source and projection optics, the method comprising:

computing a multi-variable cost function of a plurality of design variables that are representative of characteristics of the patterning process, wherein the design variables includes (a) an illumination source variable that is characteristic of the illumination source, and (b) a design layout variable that is characteristic of the design layout, wherein the multi-variable cost function is a function of a throughput of the patterning process; and reconfiguring the characteristics of the patterning process by adjusting the design variables until a predefined termination condition is satisfied.

3. The computer-readable medium of clause 2, wherein computing the multi-variable cost function includes:

obtaining a physical dose as one of the design variables, wherein the physical dose is indicative of an energy density received at the substrate through an open-frame mask accumulated through a specified exposure time, and computing the throughput as a function of the physical dose and one or more lithographic projection apparatus parameters.

4. The computer-readable medium of clause 3, wherein computing the multi-variable cost function includes:

computing a first cost function indicative of a difference between a desired throughput and the throughput, and computing a second cost function indicative of a metric associated with the patterning process for imaging the portion of the design layout onto the substrate.

5. The computer-readable medium of clause 4, wherein the predefined termination condition is satisfied by minimizing the multi-variable cost function.

6. The computer-readable medium of clause 5, wherein minimizing the multi-variable cost function is an iterative process in which each iteration includes:

minimizing the first cost function and the second cost function by adjusting the design variables, and determining whether the multi-variable cost function is minimized 7. The computer-readable medium of clause 2, wherein reconfiguring the characteristics of the patterning process includes adjusting at least one of the illumination source variable or the design layout variable until the predefined termination condition is satisfied.

8. The computer-readable medium of clause 7, wherein adjusting the illumination source variable includes adjusting a pupil shape of the illumination source.

9. The computer-readable medium of clause 7, wherein adjusting the design layout variable includes adjusting one or more characteristics of the design layout.

10. The computer-readable medium of clause 3, wherein obtaining the physical dose includes:

obtaining an exposure margin and a dose-to-clear value as the design variables, wherein the dose-to-clear value is a minimum physical dose required to cause a uniform chunk of a resist in the substrate to develop, and computing the physical dose as a function of the exposure margin and the dose-to-clear value.

11. The computer-readable medium of clause 10, wherein obtaining the exposure margin includes:

obtaining an aerial image (AI) intensity threshold value and a white mask intensity value, wherein the AI intensity threshold value is indicative of a minimum AI intensity required to predict a resist development in the substrate for a mask corresponding to the design layout, and wherein the white mask intensity value is AI intensity corresponding to an open-frame mask, and computing the exposure margin as a function of the AI intensity threshold value and the white mask intensity value.

12. The computer-readable medium of clause 10, wherein obtaining the dose-to-clear value includes:

obtaining a dose-to-size value, which is indicative of a physical dose required to print an anchor feature on the substrate, and computing the dose-to-clear value as a function of the exposure margin and the dose-to-size value.

13. The computer-readable medium of clause 10, wherein obtaining the physical dose includes:

obtaining a full-transmission dose, which is indicative of a dose received at the substrate through an open-frame mask and without any obscuration or apodization in the illumination source.

14. The computer-readable medium of clause 10, wherein obtaining the physical dose further includes:

obtaining a full-transmission dose as a function of the physical dose and a projection efficiency, wherein the projection efficiency is a function of a source map and pupil transmission associated with the illumination source.

15. The computer-readable medium of clause 2 further comprising:

generating, using the adjusted design variables, a mask pattern for a given design layout.

16. The computer-readable medium of clause 15 further comprising:

performing a patterning step using the mask pattern to print patterns corresponding to the given design layout on the substrate via the patterning process.

17. A non-transitory computer-readable medium having instructions that, when executed by a computer, cause the computer to execute a method for determining a throughput of a patterning process for imaging a portion of a design layout onto a substrate using a lithographic projection apparatus having an illumination source and projection optics, the method comprising:

obtaining a physical dose, wherein the physical dose is indicative of an energy density received from the illumination source at the substrate through an open-frame mask accumulated through a specified exposure time; and computing the throughput as a function of the physical dose and one or more lithographic projection apparatus parameters.

18. The computer-readable medium of clause 17, wherein obtaining the physical dose includes:

obtaining an exposure margin and a dose-to-clear value, wherein the dose-to-clear value is a minimum physical dose required to cause a uniform chunk of a resist in the substrate to develop, and computing the physical dose as a function of the exposure margin and the dose-to-clear value.

19. The computer-readable medium of clause 18, wherein obtaining the exposure margin includes:

obtaining an AI intensity threshold value and a white mask intensity value, wherein the AI intensity threshold value is indicative of a minimum AI intensity required to predict a resist development in the substrate for a mask corresponding to the design layout, and wherein the white mask intensity value is AI intensity corresponding to an open-frame mask, and computing the exposure margin as a function of the AI intensity threshold value and the white mask intensity value.

20. The computer-readable medium of clause 18, wherein obtaining the dose-to-clear value includes:

obtaining a dose-to-size value, which is indicative of a physical dose required to print an anchor feature on the substrate, and computing the dose-to-clear value as a function of the exposure margin and the dose-to-size value.

21. The computer-readable medium of clause 17, wherein obtaining the physical dose includes:

obtaining a full-transmission dose, which is indicative of a dose received at the substrate through an open-frame mask and without any obscuration or apodization in the illumination source.

22. The computer-readable medium of clause 17, wherein obtaining the physical dose further includes:

obtaining a full-transmission dose as a function of the physical dose and a projection efficiency, wherein the projection efficiency is a function of a source map and pupil transmission associated with the illumination source.

23. The computer-readable medium of clause 17 further comprising:

computing a multi-variable cost function of a plurality of design variables that are representative of characteristics of the patterning process, wherein the design variables includes (a) an illumination source variable that is characteristic of the illumination source, and (b) a design layout variable that is characteristic of the design layout, wherein the multi-variable cost function is a function of the throughput; and reconfiguring the characteristics of the patterning process by adjusting the design variables until a predefined termination condition is satisfied.

24. The computer-readable medium of clause 23, wherein the predefined termination condition is satisfied by minimizing the multi-variable cost function.

25. The computer-readable medium of clause 23, wherein computing the multi-variable cost function includes computing the multi-variable cost function as a function of:

a first cost function indicative of a difference between a desired throughput and the throughput, and a second cost function indicative of a metric associated with the patterning process for imaging the portion of the design layout onto the substrate.

26. The computer-readable medium of clause 25, wherein minimizing the multi-variable cost function is an iterative process in which each iteration includes:

minimizing the first cost function and the second cost function by adjusting the design variables, and determining whether the multi-variable cost function is minimized 27. A non-transitory computer-readable medium having instructions that, when executed by a computer, cause the computer to execute a method for determining a throughput of a patterning process for imaging a portion of a design layout onto a substrate using a lithographic projection apparatus having an illumination source and projection optics, the method comprising:

obtaining a dose-to-clear value, wherein the dose-to-clear value is a minimum physical dose required to cause a uniform chunk of a resist in the substrate to develop;

computing at least one of a physical dose or a full-transmission dose based on the dose-to-clear value, wherein the physical dose is indicative of an energy density received from the illumination source at the substrate through an open-frame mask accumulated through a specified exposure time, and wherein the full-transmission dose is indicative of a dose received at the substrate through an open-frame mask and without any obscuration or apodization in the illumination source; and computing the throughput as a function of (a) at least one of the physical dose or the full-transmission dose, and (b) one or more lithographic projection apparatus parameters.

28. The computer-readable medium of clause 27, wherein obtaining the dose-to-clear value includes:

obtaining an exposure margin and a dose-to-size value, which is indicative of a physical dose required to print an anchor feature on the substrate, and computing the dose-to-clear value as a function of the exposure margin and the dose-to-size value.

29. The computer-readable medium of clause 28, wherein obtaining the exposure margin includes:

obtaining an AI intensity threshold value and a white mask intensity value, wherein the AI intensity threshold value is indicative of a minimum AI intensity required to predict a resist development in the substrate for a mask corresponding to the design layout, and wherein the white mask intensity value is AI intensity corresponding to an open-frame mask, and computing the exposure margin as a function of the AI intensity threshold value and the white mask intensity value.

30. The computer-readable medium of clause 28, wherein computing at least one of the physical dose or the full-transmission dose includes:

computing the physical dose as a function of the exposure margin and the dose-to-clear value.

31. The computer-readable medium of clause 28, wherein computing at least one of the physical dose or the full-transmission dose includes:

computing the full-transmission dose as a function of the exposure margin and the dose-to-clear value.

32. A non-transitory computer-readable medium having instructions that, when executed by a computer, cause the computer to execute a method for determining a throughput of a patterning process for imaging a portion of a design layout onto a substrate using a lithographic projection apparatus having an illumination source and projection optics, the method comprising:

obtaining a full-transmission dose, which is indicative of a dose received at the substrate through an open-frame mask and without any obscuration or apodization in the illumination source; and computing the throughput as a function of the full-transmission dose and one or more lithographic projection apparatus parameters.

33. The computer-readable medium of clause 32, wherein obtaining the full-transmission dose includes:

obtaining an exposure margin and a dose-to-clear value, wherein the dose-to-clear value is a minimum physical dose required to cause a uniform chunk of a resist in the substrate to develop, and computing the full-transmission dose as a function of the exposure margin and the dose-to-clear value.

34. The computer-readable medium of clause 33, wherein obtaining the exposure margin includes:

obtaining an AI intensity threshold value and a white mask intensity value, wherein the AI intensity threshold value is indicative of a minimum AI intensity required to predict a resist development in the substrate for a mask corresponding to the design layout, and wherein the white mask intensity value is AI intensity corresponding to an open-frame mask, and computing the exposure margin as a function of the AI intensity threshold value and the white mask intensity value.

35. The computer-readable medium of clause 33, wherein obtaining the dose-to-clear value includes:

obtaining a dose-to-size value, which is indicative of a physical dose required to print an anchor feature on the substrate, and computing the dose-to-clear value as a function of the exposure margin and the dose-to-size value.

36. The computer-readable medium of clause 32 further comprising:

computing a multi-variable cost function of a plurality of design variables that are representative of characteristics of the patterning process, wherein the design variables includes (a) an illumination source variable that is characteristic of the illumination source, and (b) a design layout variable that is characteristic of the design layout, wherein the multi-variable cost function is a function of the throughput; and reconfiguring the characteristics of the patterning process by adjusting the design variables until a predefined termination condition is satisfied.

37. The computer-readable medium of clause 36, wherein the predefined termination condition is satisfied by minimizing the multi-variable cost function.

38. A non-transitory computer-readable medium having instructions that, when executed by a computer, cause the computer to execute a method for determining a throughput of a patterning process for imaging a portion of a design layout onto a substrate using a lithographic projection apparatus having an illumination source and projection optics, the method comprising:

obtaining a physical dose, wherein the physical dose is indicative of an energy density received from the illumination source at the substrate through an open-frame mask accumulated through a specified exposure time;

obtaining a full-transmission dose, which is indicative of a dose received at the substrate through the open-frame mask and without any obscuration or apodization in the illumination source, wherein the full-transmission dose is obtained as a function of the physical dose; and computing the throughput as a function of the full-transmission dose and one or more lithographic projection apparatus parameters.

39. The computer-readable medium of clause 38, wherein obtaining the full-transmission dose includes:

obtaining the full-transmission dose as a function of the physical dose and a projection efficiency, wherein the projection efficiency is a function of a source map and pupil transmission associated with the illumination source.

40. The computer-readable medium of clause 38, wherein obtaining the physical dose includes:

obtaining an exposure margin and a dose-to-clear value, wherein the dose-to-clear value is a minimum physical dose required to cause a uniform chunk of a resist in the substrate to develop, and computing the physical dose as a function of the exposure margin and the dose-to-clear value.

41. The computer-readable medium of clause 40, wherein obtaining the exposure margin includes:

obtaining an AI intensity threshold value and a white mask intensity value, wherein the AI intensity threshold value is indicative of a minimum AI intensity required to predict a resist development in the substrate for a mask corresponding to the design layout, and wherein the white mask intensity value is AI intensity corresponding to an open-frame mask, and computing the exposure margin as a function of the AI intensity threshold value and the white mask intensity value.

42. The computer-readable medium of clause 40, wherein obtaining the dose-to-clear value includes:

obtaining a dose-to-size value, which is indicative of a physical dose required to print an anchor feature on the substrate, and computing the dose-to-clear value as a function of the exposure margin and the dose-to-size value.

43. The computer-readable medium of clause 38 further comprising:

computing a multi-variable cost function of a plurality of design variables that are representative of characteristics of the patterning process, wherein the design variables includes (a) an illumination source variable that is characteristic of the illumination source, and (b) a design layout variable that is characteristic of the design layout, wherein the multi-variable cost function is a function of the throughput; and reconfiguring the characteristics of the patterning process by adjusting the design variables until a predefined termination condition is satisfied.

44. The computer-readable medium of clause 43, wherein the predefined termination condition is satisfied by minimizing the multi-variable cost function.

45. A computer-implemented method to improve a patterning process for imaging a portion of a design layout onto a substrate using a lithographic projection apparatus having an illumination source and projection optics, the method comprising:

computing, using a hardware computer system, a multi-variable cost function of a plurality of design variables that are representative of characteristics of the patterning process, wherein the design variables includes (a) an illumination source variable that is characteristic of the illumination source, and (b) a design layout variable that is characteristic of the design layout, wherein the multi-variable cost function is a function of a throughput of the patterning process; and reconfiguring, using the hardware computer system, the characteristics of the patterning process by adjusting the design variables until a predefined termination condition is satisfied.

46. The method of clause 45, wherein computing the multi-variable cost function includes:

obtaining a physical dose as one of the design variables, wherein the physical dose is indicative of an energy density received at the substrate through an open-frame mask accumulated through a specified exposure time, and computing the throughput as a function of the physical dose.

47. The method of clause 46, wherein computing the multi-variable cost function includes:
   computing a first cost function indicative of a difference between a desired throughput and the throughput, and
   computing a second cost function indicative of a metric associated with the patterning process for imaging the portion of the design layout onto the substrate.

48. The method of clause 47, wherein the predefined termination condition is satisfied by minimizing the multi-variable cost function.

49. The method of clause 48, wherein minimizing the multi-variable cost function is an iterative process in which each iteration includes:
   minimizing the first cost function and the second cost function by adjusting the design variables, and
   determining whether the multi-variable cost function is minimized 50. The method of clause 46, wherein obtaining the physical dose includes:
   obtaining an exposure margin and dose-to-clear value as the design variables, wherein the dose-to-clear value is a minimum physical dose required to cause a uniform chunk of a resist in the substrate to develop, and
   computing the physical dose as a function of the exposure margin and dose-to-clear value.

51. The method of clause 50, wherein obtaining the exposure margin includes:
   obtaining an AI intensity threshold value and a white mask intensity value, wherein the AI intensity threshold value is indicative of a minimum AI intensity required to predict a resist development in the substrate for a mask corresponding to the design layout, and wherein the white mask intensity value is AI intensity corresponding to an open-frame mask, and
   computing the exposure margin as a function of the AI intensity threshold value and the white mask intensity value.

52. The method of clause 50, wherein obtaining the dose-to-clear value includes:
   obtaining a dose-to-size value, which is indicative of a physical dose required to print an anchor feature on the substrate, and
   computing the dose-to-clear value as a function of the exposure margin and the dose-to-size value.

53. The method of clause 50, wherein obtaining the physical dose includes:
   obtaining a full-transmission dose, which is indicative of a dose received at the substrate through an open-frame mask and without any obscuration or apodization in the illumination source.

54. The method of clause 50, wherein obtaining the physical dose further includes:
   obtaining a full-transmission dose as a function of the physical dose and a projection efficiency, wherein the projection efficiency is a function of a source map and pupil transmission associated with the illumination source.

55. A computer-implemented method for determining a throughput of a patterning process for imaging a portion of a design layout onto a substrate using a lithographic projection apparatus having an illumination source and projection optics, the method comprising:
   obtaining, using a hardware computer system, a physical dose, wherein the physical dose is indicative of an energy density received at the substrate through an open-frame mask accumulated through a specified exposure time; and
   computing, using the hardware computer system, the throughput as a function of the physical dose.

56. The method of clause 55, wherein obtaining the physical dose includes:
   obtaining an exposure margin and dose-to-clear value, wherein the dose-to-clear value is a minimum physical dose required to cause a uniform chunk of a resist in the substrate to develop, and
   computing the physical dose as a function of the exposure margin and the dose-to-clear value.

57. The method of clause 56, wherein obtaining the exposure margin includes:
   obtaining an AI intensity threshold value and a white mask intensity value, wherein the AI intensity threshold value is indicative of a minimum AI intensity required to predict a resist development in the substrate for a mask corresponding to the design layout, and wherein the white mask intensity value is AI intensity corresponding to an open-frame mask, and
   computing the exposure margin as a function of the AI intensity threshold value and the white mask intensity value.

58. The method of clause 56, wherein obtaining the dose-to-clear value includes:
   obtaining a dose-to-size value, which is indicative of a physical dose required to print an anchor feature on the substrate, and
   computing the dose-to-clear value as a function of the exposure margin and the dose-to-size value.

59. The method of clause 55, wherein obtaining the physical dose includes:
   obtaining a full-transmission dose, which is indicative of a dose received at the substrate through an open-frame mask and without any obscuration or apodization in the illumination source.

60. The method of clause 55, wherein obtaining the physical dose further includes:
   obtaining a full-transmission dose as a function of the physical dose and a projection efficiency, wherein the projection efficiency is a function of a source map and pupil transmission associated with the illumination source.

61. The method of clause 55, wherein computing the throughput further includes:
   computing the throughput as a function of a plurality of design variables that are characteristic of the illumination source.

62. The method of clause 55 further comprising:
   computing a multi-variable cost function of a plurality of design variables that are representative of characteristics of the patterning process, wherein the design variables includes (a) an illumination source variable that is characteristic of the illumination source, and (b) a design layout variable that is characteristic of the design layout, wherein the multi-variable cost function is a function of the throughput; and
   reconfiguring the characteristics of the patterning process by adjusting the design variables until a predefined termination condition is satisfied.

63. The method of clause 62, wherein the predefined termination condition is satisfied by minimizing the multi-variable cost function.

64. The method of clause 62, wherein computing the multi-variable cost function includes computing the multi-variable cost function as a function of:
   a first cost function indicative of a difference between a desired throughput and the throughput, and
   a second cost function indicative of a metric associated with the patterning process for imaging the portion of the design layout onto the substrate.

65. The method of clause 64, wherein minimizing the multi-variable cost function is an iterative process in which each iteration includes:
   minimizing the first cost function and the second cost function by adjusting the design variables, and
   determining whether the multi-variable cost function is minimized.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet) patterning processes. EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

Relative dimensions of components in drawings may be exaggerated for clarity. Within the description of drawings, the same or like reference numbers refer to the same or like components or entities, and only the differences with respect to the individual embodiments are described. As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

It will be appreciated that the embodiments of the present disclosure are not limited to the exact construction that has been described above and illustrated in the accompanying drawings, and that various modifications and changes may be made without departing from the scope thereof. The present disclosure has been described in connection with various embodiments, other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The descriptions above are intended to be illustrative, not limiting. Thus, it will be apparent to one skilled in the art that modifications may be made as described without departing from the scope of the claims set out below.

What is claimed is:

1. A method for determining a throughput of a patterning process for imaging a portion of a design layout onto a substrate using a lithographic projection apparatus having an illumination system and projection optics, the method comprising:

obtaining, using a hardware computer system, a physical dose, wherein the physical dose is indicative of an energy density received at the substrate through an open-frame mask accumulated through a specified exposure time; and
computing, using the hardware computer system, the throughput as a function of the physical dose.

2. The method of claim 1, wherein obtaining the physical dose includes:
   obtaining an exposure margin and a dose-to-clear value, wherein the dose-to-clear value is a minimum physical dose required to cause a uniform chunk of a resist in the substrate to develop, and
   computing the physical dose as a function of the exposure margin and the dose-to-clear value.

3. The method of claim 2, wherein obtaining the exposure margin includes:
   obtaining an aerial image (AI) intensity threshold value and a white mask intensity value, wherein the AI intensity threshold value is indicative of a minimum AI intensity required to predict a resist development in the substrate for a mask corresponding to the design layout, and wherein the white mask intensity value is AI intensity corresponding to an open-frame mask, and
   computing the exposure margin as a function of the AI intensity threshold value and the white mask intensity value.

4. The method of claim 2, wherein obtaining the dose-to-clear value includes:
   obtaining a dose-to-size value, which is indicative of a physical dose required to print an anchor feature on the substrate, and
   computing the dose-to-clear value as a function of the exposure margin and the dose-to-size value.

5. The method of claim 1, wherein obtaining the physical dose includes obtaining a full-transmission dose, which is indicative of a dose received at the substrate through an open-frame mask and without any obscuration or apodization in the illumination system.

6. The method of claim 1, wherein obtaining the physical dose further includes obtaining a full-transmission dose as a function of the physical dose and a projection efficiency, wherein the projection efficiency is a function of a source map and pupil transmission associated with the illumination system.

7. The method of claim 1, wherein computing the throughput further includes computing the throughput as a function of a plurality of design variables that are characteristic of the illumination system.

8. The method of claim 1, further comprising:
   computing a multi-variable cost function of a plurality of design variables that are representative of characteristics of the patterning process, wherein the design variables include (a) an illumination variable that is characteristic of the illumination system, and (b) a design layout variable that is characteristic of the design layout, wherein the multi-variable cost function is a function of the throughput; and
   reconfiguring the characteristics of the patterning process by adjusting one or more of the design variables until a predefined termination condition is satisfied.

9. The method of claim 8, wherein the predefined termination condition is satisfied by minimizing the multi-variable cost function.

10. The method of claim 8, wherein computing the multi-variable cost function includes computing the multi-variable cost function as a function of:

a first cost function indicative of a difference between a desired throughput and the throughput, and a second cost function indicative of a metric associated with the patterning process for imaging the portion of the design layout onto the substrate.

11. The method of claim 10, comprising minimizing the multi-variable cost function in an iterative manner in which each iteration includes:

minimizing the first cost function and the second cost function by adjusting one or more of the design variables, and determining whether the multi-variable cost function is minimized.

12. The method of claim 8, wherein reconfiguring the characteristics of the patterning process includes adjusting the illumination variable or the design layout variable, until the predefined termination condition is satisfied.

13. The method of claim 12, comprising adjusting the illumination variable and the adjusting the illumination variable includes adjusting a pupil shape of the illumination.

14. The method of claim 12, comprising adjusting the design layout variable and the adjusting the design layout variable includes adjusting one or more characteristics of the design layout.

15. The method of claim 8, further comprising generating, using the adjusted design variables, a mask pattern for a given design layout.

16. The method of claim 15, further comprising performing a patterning step using the mask pattern to print patterns corresponding to the given design layout on the substrate via the patterning process.

17. A non-transitory computer-readable medium having instructions therein, the instructions, when executed by a computer system, are configured to cause the computer system to at least:

obtain a physical dose of a patterning process for imaging a portion of a design layout onto a substrate using a lithographic projection apparatus having an illumination system and projection optics, wherein the physical dose is indicative of an energy density received at the substrate through an open-frame mask accumulated through a specified exposure time; and compute a throughput of the patterning process as a function of the physical dose.

18. A method for determining a throughput of a patterning process for imaging a portion of a design layout onto a substrate using a lithographic projection apparatus having an illumination system and projection optics, the method comprising:

obtaining a dose-to-clear value, wherein the dose-to-clear value is a minimum physical dose required to cause a uniform chunk of a resist in the substrate to develop;

computing, by a hardware computer system, a physical dose or full-transmission dose based on the dose-to-clear value, wherein the physical dose is indicative of an energy density received from the illumination system at the substrate through an open-frame mask accumulated through a specified exposure time, and wherein the full-transmission dose is indicative of a dose received at the substrate through an open-frame mask and without any obscuration or apodization in the illumination system; and computing, by the hardware computer system, the throughput as a function of (a) the physical dose or full-transmission dose, and (b) one or more lithographic projection apparatus parameters.

19. The method of claim 18, wherein obtaining the dose-to-clear value includes:

obtaining an exposure margin and a dose-to-size value, the dose-to-size value indicative of a physical dose required to print an anchor feature on the substrate, and computing the dose-to-clear value as a function of the exposure margin and the dose-to-size value.

20. A non-transitory computer-readable medium having instructions therein, the instructions, when executed by a computer system, are configured to cause the computer system to at least:

obtain a dose-to-clear value of a patterning process for imaging a portion of a design layout onto a substrate using a lithographic projection apparatus having an illumination system and projection optics, wherein the dose-to-clear value is a minimum physical dose required to cause a uniform chunk of a resist in the substrate to develop;

compute a physical dose or full-transmission dose based on the dose-to-clear value, wherein the physical dose is indicative of an energy density received from the illumination system at the substrate through an open-frame mask accumulated through a specified exposure time, and wherein the full-transmission dose is indicative of a dose received at the substrate through an open-frame mask and without any obscuration or apodization in the illumination system; and compute a throughput of the patterning process as a function of (a) the physical dose or full-transmission dose, and (b) one or more lithographic projection apparatus parameters.

* * * * *